United States Patent
Obi et al.

(10) Patent No.: US 10,241,404 B2
(45) Date of Patent: Mar. 26, 2019

(54) PHOTOSENSITIVE RESIN COMPOSITION, PRODUCTION METHOD FOR RESIN FILM, PRODUCTION METHOD FOR ORGANIC SEMICONDUCTOR ELEMENT, AND FLUORINE-CONTAINING POLYMER

(71) Applicant: AGC Inc., Chiyoda-ku (JP)

(72) Inventors: Masaki Obi, Chiyoda-ku (JP); Tomoaki Sakurada, Chiyoda-ku (JP); Takefumi Abe, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/627,842

(22) Filed: Jun. 20, 2017

(65) Prior Publication Data

US 2017/0322488 A1 Nov. 9, 2017

Related U.S. Application Data

(63) Continuation of application No. PCT/JP2016/053070, filed on Feb. 2, 2016.

(30) Foreign Application Priority Data

Feb. 5, 2015 (JP) ................................ 2015-021586

(51) Int. Cl.
| | | |
|---|---|---|
| *G06F 7/16* | (2006.01) | |
| *G03F 7/20* | (2006.01) | |
| *G03F 7/004* | (2006.01) | |
| *G03F 7/038* | (2006.01) | |
| *C08F 8/30* | (2006.01) | |
| *C08F 220/22* | (2006.01) | |
| *C08F 290/12* | (2006.01) | |
| *G03F 7/16* | (2006.01) | |

(52) U.S. Cl.
CPC .............. *G03F 7/0388* (2013.01); *C08F 8/30* (2013.01); *C08F 220/22* (2013.01); *C08F 290/12* (2013.01); *G03F 7/0046* (2013.01); *G03F 7/0048* (2013.01); *G03F 7/162* (2013.01); *G03F 7/20* (2013.01)

(58) Field of Classification Search
CPC .................................................... G03F 7/0388
See application file for complete search history.

(56) References Cited

U.S. PATENT DOCUMENTS

| | | |
|---|---|---|
| 5,229,229 A | 7/1993 | Sato et al. |
| 2004/0019176 A1 | 1/2004 | Araki et al. |
| 2010/0010164 A1 | 1/2010 | Tanaka et al. |
| 2010/0324224 A1 | 12/2010 | Tanaka et al. |
| 2015/0344703 A1 | 12/2015 | Takao et al. |
| 2016/0349614 A1* | 12/2016 | Wright .................. G03F 7/0046 |

FOREIGN PATENT DOCUMENTS

| | | |
|---|---|---|
| EP | 2 028 200 A1 | 2/2009 |
| JP | 4-9851 | 1/1992 |
| JP | 2005-336484 | 12/2005 |
| JP | 2007-99816 | 4/2007 |
| JP | 2008-208226 | 9/2008 |
| JP | 2010-34342 | 2/2010 |
| JP | 2012-58307 | 3/2012 |
| JP | 2012-74683 | 4/2012 |
| JP | 5556016 | 7/2014 |
| JP | 2014-196455 | 10/2014 |
| WO | WO 2008/093776 A1 | 8/2008 |
| WO | WO 2008/099782 A1 | 8/2008 |
| WO | WO 2008/105259 A1 * | 9/2008 |
| WO | WO 2011/096371 A1 | 8/2011 |
| WO | WO-2011/096371 A1 * | 8/2011 |
| WO | WO 2014/171431 A1 | 10/2014 |
| WO | WO 2015/002204 A1 | 1/2015 |

OTHER PUBLICATIONS

ChemicalBook 1 H,1 H,2H,2H-Heptadecafluorodecyl acrylate | 27905-45-9 downloaded from Web Apr. 1, 2018 copyright 2017, 4 pages.*
Sigma-Aldrich.com, Product Name 3,3,4,4,5,5,6,6,7,7,8,8,8-tridecafluoroctyl methacrylate, 1 page down loaded on Apr. 1, 2019 from Aigma-Aldrich online.*
Sigma-Aldrich , 474487 Aldrich 1H,1H,2H,2H-Perfluorodecyl acrylate 474487 downloaded from https://www.sigmaaldrich.com/catalog/product/aldrich/474487?lang=en&region=US on Apr. 1, 2018, 3 pages.*
International Search Report dated Mar. 15, 2016 in PCT/JP2016/053070, filed on Feb. 2, 2016.

* cited by examiner

*Primary Examiner* — Cynthia Hamilton
(74) *Attorney, Agent, or Firm* — Oblon, McClelland, Maier & Neustadt, L.L.P.

(57) ABSTRACT

To provide a photosensitive resin composition containing a crosslinkable fluororesin which hardly damages a substrate of e.g. an organic semiconductor when a resin film is formed, and a resin film using it, an organic semiconductor device and its production process, and a fluororesin suitable for the photosensitive resin composition.

A photosensitive resin composition comprising a fluororesin having a polymerizable carbon-carbon double bond and having a fluorine atom content of at least 47 mass %, a crosslinking agent having a polymerizable carbon-carbon double bond (excluding the fluororesin), a photoinitiator and a non-aromatic fluorinated solvent.

19 Claims, 2 Drawing Sheets

PHOTOSENSITIVE RESIN COMPOSITION, PRODUCTION METHOD FOR RESIN FILM, PRODUCTION METHOD FOR ORGANIC SEMICONDUCTOR ELEMENT, AND FLUORINE-CONTAINING POLYMER

TECHNICAL FIELD

The present invention relates to a photosensitive resin composition, a method for producing a resin film, a method for producing an organic semiconductor device and a fluorinated polymer.

BACKGROUND ART

For an organic semiconductor device, when an interlayer insulating film and a gate insulating film are formed on source electrodes, drain electrodes and an organic semiconductor layer, contact holes and the like may be formed on the insulating film by photolithography. As a method of forming an insulating film having contact holes and the like, for example, a method may be mentioned in which a photosensitive resin composition containing a crosslinkable fluororesin, a crosslinking agent, a photoinitiator and a solvent is applied to source electrodes, drain electrodes and an organic semiconductor layer, the solvent is removed, and an insulating film having contact holes and the like is formed by photolithography.

As a photosensitive resin composition for forming an insulating film, for example, a photosensitive resin composition containing a fluororesin having a hydroxy group, a compound having a cyclic ether structure (such as an oxetane ring structure), a photo cation polymerization initiator and a fluorinated solvent has been proposed (Example in Patent Document 1).

PRIOR ART DOCUMENTS

Patent Documents

Patent Document 1: JP-A-2012-074683

DISCLOSURE OF INVENTION

Technical Problem

In the photosensitive resin composition in Patent Document 1, the fluorine atom content in the crosslinkable fluororesin is low. For example, the fluorine atom content in the fluororesin having a hydroxy group used in Example in Patent Document 1 is about 25 mass %. Accordingly, it is substantially essential to use, as the fluorinated solvent, an aromatic fluorinated solvent in which the solubility of a fluororesin having a low fluorine atom content is high.

However, in such an aromatic fluorinated solvent, the solubility of an organic compound containing no fluorine is also high. Accordingly, when the photosensitive resin composition in Patent Document 1 is applied to an organic semiconductor, the organic semiconductor layer may be damaged by the aromatic fluorinated solvent in some cases, and properties of an organic semiconductor device may be deteriorated in some cases (for example, the carrier mobility decreases).

It is an object of the present invention to provide a photosensitive resin composition containing a crosslinkable fluororesin which will hardly damage the substrate of e.g. an organic semiconductor when a resin film is formed; a method for producing a resin film which will hardly damage the substrate of e.g. an organic semiconductor layer; a method for producing an organic semiconductor device which will hardly damage an organic semiconductor layer when an insulating film is formed from the photosensitive resin composition; a fluorinated polymer having crosslinkable groups, which is highly soluble in an aromatic fluorinated solvent; and a method for producing the fluorinated polymer.

Solution to Problem

The present invention provides a photosensitive resin composition, a method for producing a resin film, a method for producing an organic semiconductor device, a fluorinated polymer and its production method, having the following constructions [1] to [12].

[1] A photosensitive resin composition comprising the following fluororesin (A), the following crosslinking agent (B), a photoinitiator and the following solvent (D):
 fluororesin (A): a fluororesin having a polymerizable carbon-carbon double bond and having a fluorine atom content of at least 47 mass %;
 crosslinking agent (B): a crosslinking agent having a polymerizable carbon-carbon double bond (excluding the fluororesin (A)); and
 solvent (D): a solvent composed of a fluorinated compound having no aromatic ring, which is liquid at 25° C.

[2] The photosensitive resin composition according to [1], wherein the fluororesin (A) is composed of a copolymer having units represented by the following formula (u1) and units represented by the following formula (u21):

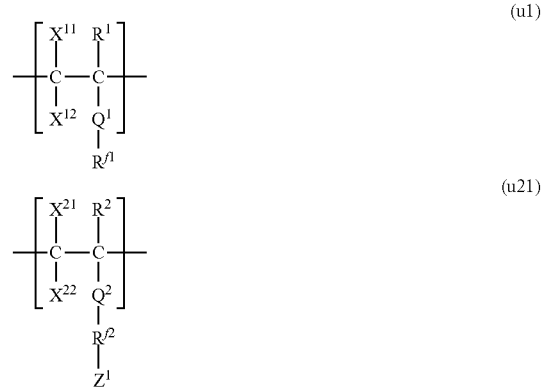

wherein each of $R^1$ and $R^2$ which are independent of each other, is a hydrogen atom, a methyl group, an ethyl group or a halogen atom,
 each of $X^{11}$, $X^{12}$, $X^{21}$ and $X^{22}$ which are independent of one another, is a hydrogen atom or a halogen atom,
 is each of $Q^1$ and $Q^2$ which are independent of each other, is a bivalent linking group,
 $R^{f1}$ is a $C_{1\text{-}10}$ perfluoroalkyl group or a $C_{2\text{-}10}$ perfluoroalkyl group having an etheric oxygen atom between carbon-carbon atoms,
 $R^{f2}$ is a $C_{1\text{-}10}$ perfluoroalkylene group or a $C_{2\text{-}10}$ perfluoroalkylene group having an etheric oxygen atom between carbon-carbon atoms, and
 $Z^1$ is a monovalent organic group having a polymerizable carbon-carbon double bond.

[3] The photosensitive resin composition according to [1] or [2], wherein the crosslinking agent (B) is a crosslinking agent having fluorine atoms, having a fluorine atom content of at least 20 mass %.

[4] The photosensitive resin composition according to any one of [1] to [3], which has a solid content concentration of from 3 to 40 mass %.

[5] The photosensitive resin composition according to any one of [1] to [4], wherein based on the total amount (100 mass %) of the fluororesin (A) and the crosslinking agent (B), the proportion of the fluororesin (A) is from 60 to 90 mass %, and the proportion of the crosslinking agent (B) is from 10 to 40 mass %.

[6] The photosensitive resin composition according to any one of [1] to [5], wherein the solvent (D) is a fluorinated aliphatic hydrocarbon compound, a fluorinated alkylamine compound, a fluorinated alcohol compound, a fluorinated aliphatic ether compound or a fluorinated cyclic ether compound.

[7] The photosensitive resin composition according to any one of [1] to [6], wherein the boiling point of the solvent (D) is at least 80° C.

[8] The photosensitive resin composition according to any one of [1] to [7], which is a composition for forming an insulating film, used to form an insulating film on an organic semiconductor layer.

[9] A method for producing a resin film, which comprises applying the photosensitive resin composition as defined in any one of [1] to [8] to a substrate, and removing the solvent (D) to form a film, followed by exposure.

[10] A method for producing an organic semiconductor device, which comprises a step of applying the photosensitive resin composition as defined in any one of [1] to [8] to an organic semiconductor layer, and removing the solvent (D), followed by exposure to form an insulating film.

[11] A fluorinated polymer having units represented by the following formula (u1) and units represented by the following formula (u21) and having a fluorine atom content of at least 47 mass %:

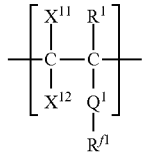

(u1)

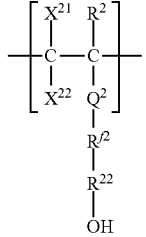

(u21)

wherein each of $R^1$ and $R^2$ which are independent of each other, is a hydrogen atom, a methyl group, an ethyl group or a halogen atom, each of $X^{11}$, $X^{12}$, $X^{21}$ and $X^{22}$ which are independent of one another, is a hydrogen atom or a halogen atom, each of $Q^1$ and $Q^2$ which are independent of each other, is a bivalent linking group, $R^{f1}$ is a $C_{1-10}$ perfluoroalkyl group or a $C_{2-10}$ perfluoroalkyl group having an etheric oxygen atom between carbon-carbon atoms, $R^{f2}$ is a $C_{1-10}$ perfluoroalkylene group or a $C_{2-10}$ perfluoroalkylene group having an etheric oxygen atom between carbon-carbon atoms, and $Z^1$ is a monovalent organic group having a polymerizable carbon-carbon double bond.

[12] A method for producing a fluorinated polymer as defined in [11], which comprises reacting a polymer having units represented by the following formula (u1) and units represented by the following formula (u41) with a compound having a reactive functional group capable of reacting with a hydroxy group, and a polymerizable carbon-carbon double bond:

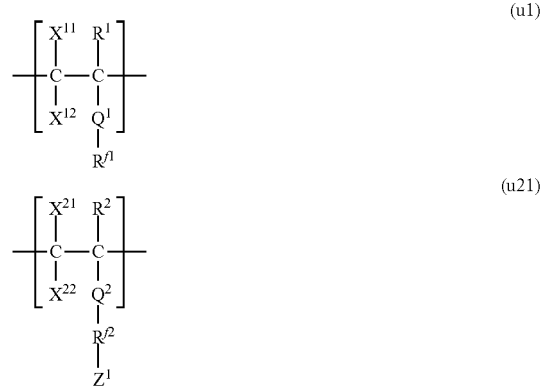

wherein $R^{22}$ is a $C_{1-6}$ alkylene group.

Advantageous Effects of Invention

The photosensitive resin composition of the present invention is a photosensitive resin composition which will hardly damage the substrate of e.g. an organic semiconductor when a resin film is formed.

According to the method for producing a resin film of the present invention, the substrate of e.g. an organic semiconductor will hardly be damaged when a resin film is formed.

According to the method for producing an organic semiconductor device of the present invention, an organic semiconductor layer will hardly be damaged when an insulating film is formed.

The crosslinkable fluororesin of the present invention has a high solubility in a non-aromatic fluorinated solvent.

DESCRIPTION OF EMBODIMENTS

Figure 1:
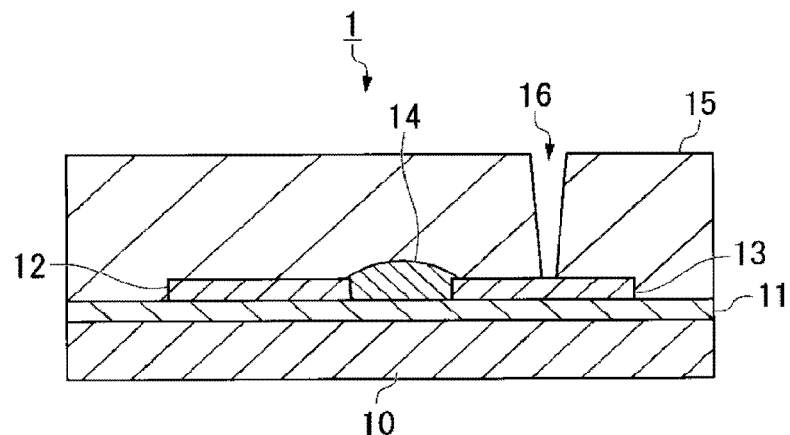
FIG. 1 is a cross-sectional view illustrating an example of an organic semiconductor device.

In this specification, the meanings of the following terms are as follows.

An "undried coating film" means a film formed by applying a photosensitive resin composition containing a solvent, before removal of the solvent.

A "dry coating film" means a film having the solvent removed from the undried coating film.

A "cured film" means a film obtained by curing the dry coating film. Further, the cured film may also be referred to as a resin film.

"Having insulating property" means that the volume resistivity as measured by a double-ring electrode method is at least $10^{10}$ Ω·cm.

A "unit" means a moiety derived from a monomer, present in a polymer to constitute the polymer. Further, one having a structure of a certain unit chemically converted after forming a polymer will also be referred to as a unit.

A "perfluoroalkyl group" means a group having all hydrogen atoms in an alkyl group substituted with fluorine atoms.

A "perfluoroalkylene group" means a group having all hydrogen atom in an alkylene group substituted with fluorine atoms.

A "(meth)acryloyl group" generically means an acryloyl group and a methacryloyl group.

A "(meth)acrylate" generically means an acrylate and a methacrylate.

The "dielectric constant" is a value measured in accordance with ASTM D150 at a frequency of 1 MHz.

The "volume resistivity" is a value measured in accordance with ASTM D257.

The "breakdown voltage" is a value measured by a mercury probe (manufactured by SSM, tradename: SSM-495).

In this specification, a unit represented by the formula (u1) will sometimes be referred to as a "unit (u1)". The same applies to units represented by other formulae.

A group represented by the formula (g11) will sometimes be referred to as a "group (g11)". The same applies to groups represented by other formulae.

Further, a compound represented by the formula (m1) will sometimes be referred to as a "compound (m1)". In a case where the compound represented by the formula (m1) is a monomer, it may sometimes be referred to as a "monomer (m1)". The same applies to groups represented by other formulae.

[Photosensitive Resin Composition]

The photosensitive resin composition of the present invention comprises a fluororesin (A), a crosslinking agent (B), a photoinitiator and a solvent (D).

(Fluororesin (A))

The fluororesin (A) is a fluororesin having a polymerizable carbon-carbon double bond and having a fluorine atom content of at least 47 mass %. The fluororesin (A) is crosslinkable by having a polymerizable carbon-carbon double bond, and may be cured by crosslinking together with the crosslinking agent (B). Hereinafter, the "polymerizable carbon-carbon double bond" will sometimes be referred to simply as a "double bond" unless it is specified as another double bond.

Since the fluororesin (A) has fluorine atoms, a resin film to be formed tends to have a low dielectric constant and a low dielectric loss. When the resin film has a low dielectric constant and a low dielectric loss, delay of the signal transmission rate between the multilayer wirings of an organic semiconductor device having the resin film as an insulating film can be suppressed, and an organic semiconductor device excellent in electrical properties can be obtained. Having fluorine atoms is preferred also in view of low water absorption of the resin film. The low water absorption of the resin film is excellent in that a change of the bonding state at electrodes bonded to the insulating film consisting of the resin film, the wiring portions at a periphery thereof, etc. can be suppressed, and degeneration (such as rusting) of the metal can be suppressed, and the reliability of an organic semiconductor device is increased.

The double bond in the fluororesin (A) reacts with the double bond in the crosslinking agent (B) by radicals generated from the photoinitiator and may form a crosslinked structure.

The double bond in the fluororesin (A) is preferably present as a part of a pendant group of the fluororesin (A), with a view to readily forming the crosslinked structure.

The group having a double bond may, for example, be a (meth)acryloyl group, a vinyl group, an allyl group, an isopropenyl group, a 3-butenyl group or a trifluorovinyl group. It is preferably at least one member selected from the group consisting of a (meth)acryloyl group, a vinyl group and an allyl group in view of high reactivity and with a view to readily obtaining a cured film having a high crosslink density, more preferably a (meth)acryloyl group, particularly preferably an acryloyl group.

The fluorine atom content in the fluororesin (A) is at least 47 mass %, preferably at least 50 mass %, particularly preferably at least 51 mass %. When the fluorine atom content is at least the lower limit value of the above range, the solubility of the fluororesin (A) in the solvent (D) will be excellent. Further, the fluororesin (A) will be excellent in the low dielectric constant and the low dielectric loss. The upper limit value of the fluorine atom content is not particularly limited, and is preferably at most 75 mass %, particularly preferably at most 70 mass %.

The mass average molecular weight (Mw) of the fluororesin (A) is preferably from 10,000 to 1,000,000, more preferably from 10,000 to 300,000, particularly preferably from 11,000 to 300,000. The number average molecular weight (Mn) of the fluororesin (A) is preferably from 5,500 to 500,000, particularly preferably from 5,500 to 150,000. When the mass average molecular weight and the number average molecular weight of the fluororesin (A) are at least the lower limit values of the above ranges, excellent film forming property will be achieved. When the mass average molecular weight of the fluororesin (A) is at most the upper limit value of the above range, the solubility of the fluororesin (A) in the solvent (D) will be more excellent.

The dielectric constant of the fluororesin (A) is preferably at most 4.5, particularly preferably at most 3.5. When the dielectric constant of the fluororesin (A) is at most the upper limit value of the above range, the signal delay between multilayer wirings can be prevented.

The volume resistivity of the fluororesin (A) is preferably at least $10^{10}$ Ω·cm, particularly preferably at least $10^{12}$ Ω·cm. When the volume resistivity of the fluororesin (A) is at least the lower limit value of the above range, excellent insulating properties are achieved.

The breakdown voltage of the fluororesin (A) is preferably at least 1 kV/mm, particularly preferably at least 5 kV/mm. When the breakdown voltage of the fluororesin (A) is at least the lower limit value of the above range, dielectric breakdown by a high voltage can be prevented.

The fluororesin (A) is preferably a fluororesin composed of a fluorinated polymer having a double bond obtained by addition polymerization, condensation polymerization or the like, or a fluororesin composed of a polymer obtained by introducing a group having a double bond into a fluorinated polymer having no double bond obtained by addition polymerization, condensation polymerization or the like. Since a polymer obtained by addition polymerization of a monomer having a double bond usually has no double bond, a polymer having a double bond is obtained by introducing a group having a double bond into the obtained polymer. With respect to a polymer obtained by polymerization other than the addition polymerization (for example, ring-opening addition polymerization or condensation polymerization) of a monomer having a double bond, a polymer having a double bond can be obtained by using a monomer having a double bond. For example, using a condensation-polymerizable monomer having a double bond, a polymer having a double bond can be obtained by condensation polymerization. A condensation polymer having a double bond may be obtained by introducing a group having a double bond into a condensation polymer having no double bond obtained from a condensation-polymerizable monomer having no double bond.

The fluorinated polymer may, for example, be specifically a fluorinated (meth)acrylate polymer, a fluorinated vinyl polymer, a polymer having a fluorinated aliphatic ring structure in its main chain, a fluorinated polyarylene prepolymer, a fluorinated phenol resin oligomer or a fluorinated polyimide.

The fluororesin (A) is preferably a fluorinated polymer having a double bond, obtained by introducing a group having a double bond into a fluorinated polymer having no double bond. In view of high solubility in the solvent (D), preferred is a fluorinated (meth)acrylate polymer or a fluorinated polymer obtained by introducing a group having a double bond into a fluorinated vinyl polymer, more preferred is a fluororesin composed of the after-mentioned fluorinated polymer (A1) or a fluororesin composed of the fluorinated polymer (A2), and in view of excellent smoothness of the surface of the resin film, particularly preferred is a fluororesin composed of the fluorinated polymer (A1).

<Fluorinated Polymer (A1)>

The fluorinated polymer (A1) is a copolymer having units (u1) and units (u21) represented by the following formulae:

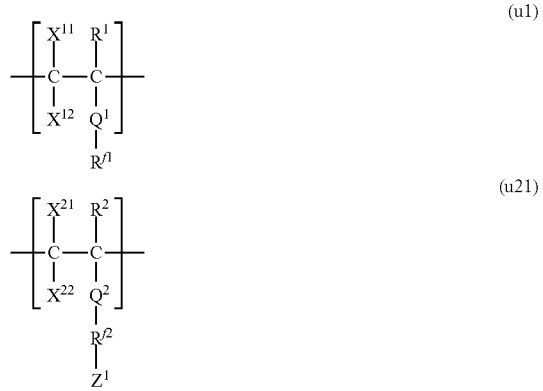

Each of $R^1$ and $R^2$ which are independent of each other, is a hydrogen atom, a methyl group, an ethyl group or a halogen atom. In view of availability of the material, preferred is a a hydrogen atom or a methyl group, and with a view to making the glass transition temperature of the fluorinated polymer (A1) high, particularly preferred is a methyl group.

Each of $X^{11}$, $X^{12}$, $X^{21}$ and $X^{22}$ which are independent of one another, is a hydrogen atom or a halogen atom. In view of excellent reactivity, preferred is a hydrogen atom.

Each of $Q^1$ and $Q^2$ which are independent of each other, is a bivalent linking group.

The bivalent linking group is preferably a linking group composed of a bivalent bond having an oxygen atom, a nitrogen atom or the like, or a linking group having such a bond and a bivalent hydrocarbon group connected.

The bivalent bond having an oxygen atom, a nitrogen atom or the like may, for example, be an ether bond (—O—), an ester bond (—C(O)O—), an amide bond (—NHC(O)—), a urethane bond (—NHC(O)O—) or a urea bond (—NHC(O)NH—). The bivalent hydrocarbon group connected to such a bond may, for example, be an alkylene group, a cycloalkylene group or an arylene group, and is particularly preferably an alkylene group.

As $Q^1$, for example, the following groups (g21) to (g24) may be mentioned.

$$—C(O)O—R^{11}— \quad (g21),$$

$$—C(O)O—R^{10}—NHC(O)O—R^{11}— \quad (g22),$$

$$—C(O)O—R^{10}—CH(OH)CH_2O—R^{11}— \quad (g23),$$

$$—CH_2—O—R^{11}— \quad (g24),$$

wherein each of $R^{10}$ and $R^{11}$ which are independent of each other, is a $C_{1-6}$ alkylene group. The left side of such a group is bonded to the main chain of the copolymer, and the right side is bonded to $R^{f1}$.

As $Q^2$, for example, the following groups (g31) to (g34) may be mentioned.

$$—C(O)O—R^{21}— \quad (g31),$$

$$—C(O)O—R^{20}—NHC(O)O—R^{21}— \quad (g32),$$

$$—C(O)O—R^{20}—CH(OH)CH_2O—R^{21}— \quad (g33),$$

$$—CH_2—O—R^{21}— \quad (g34),$$

wherein each of $R^{20}$ and $R^{21}$ which are independent of each other, is a $C_{1-6}$ alkylene group. The left side of such a group is bonded to the main chain of the copolymer, and the right side is bonded to $R^{f2}$.

As specific examples of $Q^1$ and $Q^2$, for example, the following groups may be mentioned.
—C(O)O—CH$_2$—,
—C(O)O—CH$_2$CH$_2$—,
—C(O)O—CH$_2$CH$_2$—NHC(O)O—CH$_2$—,
—C(O)O—CH$_2$CH$_2$—NHC(O)O—CH$_2$CH$_2$—,
—CH$_2$—O—CH$_2$—,
—CH$_2$—O—CH$_2$—CH$_2$—.

The left side of such a group is bonded to the main chain of the copolymer, and the right side is bonded to $R^{f1}$ or $R^{f2}$.

$R^{f1}$ is a $C_{1-10}$ perfluoroalkyl group or a $C_{2-10}$ perfluoroalkyl group having an etheric oxygen atom between carbon-carbon atoms. The perfluoroalkyl group may be linear, branched or cyclic.

As specific examples of $R^{f1}$, for example, the following groups may be mentioned.
—CF$_2$CF$_2$CF$_2$CF$_3$,
—CF$_2$CF$_2$CF$_2$CF$_2$CF$_2$CF$_3$,
—CF$_2$CF$_2$CF$_2$CF(CF$_3$)CF$_3$,
—CF(CF$_3$)OCF$_2$CF$_2$CF$_3$,
—CF$_2$OCF$_2$CF$_2$OCF$_3$,
—CF$_2$OCF$_2$CF$_2$OCF$_2$CF$_3$,
a perfluoroadamantyl group.

$R^{f2}$ is a $C_{1-10}$ perfluoroalkylene group or a $C_{2-10}$ perfluoroalkylene group having an etheric oxygen atom between carbon-carbon atoms. The perfluoroalkylene group may be linear, branched or cyclic.

As specific examples of $R^{12}$, for example, the following groups may be mentioned.

—$CF_2CF_2$—,
—$CF_2CF_2CF_2$—,
—$CF_2CF_2CF_2CF_2$—,
—$CF_2CF_2CF_2CF_2CF_2CF_2CF_2$—,
—$CF_2CF_2CF_2CF_2CF_2CF_2CF_2CF_2$—,
—$CF_2OCF_2CF_2OCF_2$—,
—$CF_2OCF_2CF_2OCF_2CF_2OCF_2$—.

$Z^1$ is a monovalent organic group having a double bond. $Z^1$ may have two or more double bonds, however, it preferably has one double bond. The bond terminal (the terminal bonded to $R^{f2}$) of $Z^1$ is a carbon atom, and the carbon atom at the bond terminal is preferably a carbon atom of a polyvalent hydrocarbon group. The polyvalent hydrocarbon group is preferably a bivalent hydrocarbon group, and the bivalent hydrocarbon group may, for example, be an alkylene group, a cycloalkylene group or an arylene group. The hydrocarbon group and the double bond are bonded by a bond having an oxygen atom, a nitrogen atom or the like, and the bond may, for example, be an ether bond (—O—), an ester bond (—C(O)O—), an amide bond (—NHC(O)—), a urethane bond (—NHC(O)O—) or a urea bond (—NHC(O)NH—).

$Z^1$ is preferably a monovalent organic group having a $C_{1-6}$ alkylene group, the above bond and a double bond connected, particularly preferably an acryloyloxyalkyl group or a group having a hydroxyalkyl group and an isocyanatealkyl acrylate bonded.

As $Z^1$, for example, the following groups (g41) to (g44) may be mentioned.

—$R^{22}$—OC(O)—$CR^{23}$=$CH_2$ (g41),

—$R^{22}$—OC(O)NH—$R^{24}$—OC(O)—$CR^{23}$=$CH_2$ (g42),

—$R^{22}$—O—$CH_2$—CH=$CH_2$ (g43),

—$R^{22}$—O—CH=$CH_2$ (g44), wherein each of $R^{22}$ and $R^{24}$ which are independent of each other, is a $C_{1-6}$ alkylene group, and $R^{23}$ is a hydrogen atom or a methyl group.

As specific examples of $Z^1$, for example, the following groups may be mentioned.

—$CH_2$—OC(O)—CH=$CH_2$,
—$CH_2$—OC(O)—C($CH_3$)=$CH_2$,
—$CH_2$—OC(O)NH—$CH_2CH_2$—OC(O)—CH=$CH_2$,
—$CH_2$—OC(O)NH—$CH_2CH_2$—OC(O)—C($CH_3$)=$CH_2$,
—$CH_2$—O—$CH_2$—CH=$CH_2$,
—$CH_2$—O—CH=$CH_2$.

The fluorinated polymer (A1) may have units other than the units (u1) and the unit (u21) within a range not to impair the effects of the present invention.

The units other than the units (u1) and the units (u21) may, for example, be units derived from the after-mentioned monomer (m3) or the after-mentioned unreacted units (u41).

The proportions of the respective units in the fluorinated polymer (A1) are not particularly limited. In view of the balance between the solubility of the fluorinated polymer (A1) in the solvent (D) and the reactivity with the cross-linking agent (B), the proportion of the units (u1) based on all the units (100 mol %) constituting the fluorinated polymer (A1) is preferably from 60 to 95 mol %, particularly preferably from 70 to 90 mol %, and the proportion of the units (u21) is preferably from 5 to 40 mol %, particularly preferably from 10 to 30 mol %.

<Process for Producing Fluorinated Polymer (A1)>

The fluorinated polymer (A1) may be produced, for example, by a process comprising the following step (i) and step (ii).

(i) A step of polymerizing a monomer component containing a monomer (m1) and a monomer (m2) represented by the following formulae and as the case requires, another monomer, in the presence of a polymerization initiator to obtain a precursor (P1) having units (u1) (units derived from the monomer (m1)) and units (u41) (units derived from the monomer (m2)) represented by the following formulae. The monomer other than the monomer (m1) and the monomer (m2) is preferably the after-mentioned monomer (m3).

$CX^{11}X^{12}$=$CR^1$-$Q^1$-$R^{f1}$ (m1), $CX^{21}X^{22}$=$CR^2$-$Q^2$-$R^{f2}$—$R^{22}$—OH (m2),

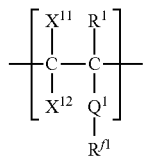  (u1)

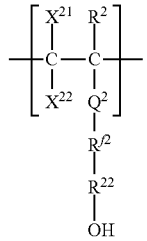  (u41)

wherein $R^1$, $R^2$, $X^{11}$, $X^{12}$, $X^{21}$, $X^{22}$, $Q^1$, $Q^2$, $R^{f1}$, $R^{f2}$ and $R^{22}$ are as defined above.

(ii) A step of reacting a reactive functional group in a compound having a reactive functional group capable of reacting with a hydroxy group and a double bond (hereinafter referred to as compound (m4)) and a hydroxy group in the unit (u41) of the precursor (P1) to obtain a fluorinated polymer (A1) having units (u1) and units (u21).

In the step (ii), not all the hydroxy groups in the units (u41) may be reacted with the compound (m4), and unreacted hydroxy groups may remain. That is, the fluorinated polymer (A1) may have the units (u41).

Step (i):

The monomer (m1) may, for example, be a known (meth)acrylate, vinyl ether, vinyl ester or allyl ether, having $R^{f1}$.

The monomer (m1) wherein $Q^1$ is any one of the groups (g21) to (g24) is obtained, for example, by reacting any one of compounds (m11) to (m13) represented by the following formulae, and a compound (f1). In the case of the compound (m11) or (m13), the reaction is carried out in the presence of a basic compound, and in the case of the compound (m12), the reaction is carried out in the presence of a urethane-forming catalyst.

$CX^{11}X^{12}$=$CR^1$—C(O)—$X^{13}$ (m11), $CX^{11}X^{12}$=$CR^1$—C(O)O—$R^{10}$—NCO (m12), $$CX^{11}X^{12}=CR^1-CH_2-X^{13} \qquad (m13),$$

$$HO-R^{11}-R^{f1} \qquad (f1),$$

wherein $X^{13}$ is a chlorine atom, a bromine atom or an iodine atom, and $R^1$, $X^{11}$, $X^{12}$, $R^{10}$, $R^{11}$ and $R^{f1}$ are as defined above.

The monomer (m2) may, for example, be a known (meth) acrylate, vinyl ether, vinyl ester or allyl ether, having $R^{f2}$ and a hydroxy group.

The monomer (m2) wherein $Q^2$ is any one of the groups (g31) to (g34) may be obtained, for example, by reacting any one of compounds (m21) to (m24) represented by the following formulae, and a compound (f2). In the case of the compound (m21) or (m24), the reaction is carried out in the presence of a basic compound, and in the case of the compound (m22), the reaction is carried out in the presence of a urethane-forming catalyst.

$$CX^{21}X^{22}=CR^2-C(O)-X^{23} \qquad (m21),$$

$$CX^{21}X^{22}=CR^2-C(O)O-R^{20}-NCO \qquad (m22),$$

$$CX^{21}X^{22}=CR^2-C(O)O-R^{20}\text{-Ep} \qquad (m23),$$

$$CX^{21}X^{22}=CR^2-CH_2-X^{23} \qquad (m24),$$

$$HO-R^{21}-R^{f2}-R^{22}-OH \qquad (f2).$$

wherein $X^{23}$ is a chlorine atom, a bromine atom or an iodine atom, $R^2$, $X^{21}$, $X^{22}$, $R^{20}$, $R^{21}$, $R^{22}$ and $R^{f2}$ are as defined above, and Ep is an epoxy group.

The monomer (m3) is a monomer other than the monomer (m1), the monomer (m2) and the after-mentioned monomer (m5). The monomer (m3) is preferably a compound having a double bond, having no fluorine atom nor reactive group. The monomer (m3) may, for example, be specifically a (meth)acrylate compound, an aromatic vinyl compound, a vinyl ether compound or a vinylidene compound, and among them, a (meth)acrylate compound is preferred, and a methacrylate compound is particularly preferred.

The compound (m3) may, for example, be specifically methyl (meth)acrylate, ethyl (meth)acrylate, isopropyl (meth)acrylate, isobutyl (meth)acrylate, tert-butyl (meth) acrylate, behenyl (meth)acrylate, phenyl (meth)acrylate, isooctyl (meth)acrylate, isodecyl (meth)acrylate, cyclohexyl (meth)acrylate, benzyl methacrylate, styrene, 4-hydroxystyrene, tert-butyl vinyl ether, cyclohexyl vinyl ether, 1,1-dichloroethylene or 1,1-difluoroethylene.

As the polymerization initiator, a known polymerization initiator may be mentioned.

As the polymerization method, solution polymerization, bulk polymerization, emulsion polymerization or suspension polymerization may, for example, be mentioned, and solution polymerization is preferred.

As a solvent used for solution polymerization, a known solvent may be mentioned.

Step (ii):

In a case where $Z^1$ is the group (g41), $X^{24}$ in a compound (m41) represented by the following formula and the hydroxy group in the unit (u41) of the precursor (P1) are reacted in the presence of a basic compound to obtain a fluorinated polymer (A1) having the units (u1) and the units (u21).

$$X^{24}-C(O)-CR^{23}=CH_2 \qquad (m41)$$

wherein $X^{24}$ is a chlorine atom, a bromine atom or an iodine atom, and $R^{23}$ is as defined above.

In a case where $Z^1$ is the group (g42), an isocyanate group in a compound (m42) represented by the following formula and the hydroxy group in the unit (u41) of the precursor (P1) are reacted in the presence of a urethane-forming catalyst to obtain a fluorinated polymer (A1) having the units (u1) and the units (u21).

$$OCN-R^{24}-OC(O)-CR^{23}=CH_2 \qquad (m42)$$

wherein $R^{23}$ and $R^{24}$ are as defined above.

In a case where $Z^1$ is the group (g43), $X^{24}$ in a compound (m43) represented by the following formula and the hydroxy group in the unit (u41) of the precursor (P1) are reacted in the presence of a basic compound to obtain a fluorinated polymer (A1) having the units (u1) and the units (u21).

$$X^{24}-CH_2-CH=CH_2 \qquad (m43)$$

wherein $X^{24}$ is as defined above.

In a case where $Z^1$ is the group (g44), $R^{25}$ in a compound (m44) represented by the following formula and the hydroxy group in the unit (u41) of the precursor (P1) are reacted in the presence of a palladium catalyst to obtain a fluorinated polymer (A1) having the units (u1) and the units (u21).

$$R^{25}-O-CH=CH_2 \qquad (m44)$$

wherein $R^{25}$ is a monovalent alkyl group.

<Fluorinated Polymer (A2)>

The fluorinated polymer (A2) is a copolymer having units (u1) and units (u22) represented by the following formulae:

The units (u1) are the same as the units (u1) of the fluorinated polymer (A1), and the description is omitted.

Further, with respect to the units (u22) also, description of the same symbols as in the units (u21) of the fluorinated polymer (A1) is omitted.

$Q^3$ is $-C(O)O-R^{31}-$, $-CH_2-$, $-CH_2-O-R^{31}-$, $O-R^{31}-$ or $-OC(O)-R^{31}-$.

$R^{31}$ is a $C_{1-6}$ alkylene group. The left side of such a group is bonded to the main chain of the copolymer, and the right side is bonded to $Z^2$.

As specific examples of $Q^3$, for example, the following groups may be mentioned.

$-C(O)O-CH_2CH_2-$, and $-CH_2-$.

The left side of such a group is bonded to the main chain of the copolymer, and the right side is bonded to $Z^2$.

$Z^2$ is the monovalent organic group (having no fluorine atom) having a double bond.

$Z^2$ may, for example, be a combination of a double bond, a bond (such as an ether bond (—O—), an ester bond (—C(O)O—), an amide bond (—NHC(O)—), a urethane bond (—NHC(O)O—) or a urea bond (—NHC(O)NH—)), and an alkylene group.

As $Z^2$, for example, the following groups (g51) to (g54) may be mentioned.

—OC(O)—CR²³=CH₂  (g51),

—OC(O)NH—R²⁴—OC(O)—CR²³=CH₂  (g52),

—O—CH₂—CH=CH₂  (g53),

—O—CH=CH₂  (g54).

wherein $R^{23}$ and $R^{24}$ are as defined above.

As specific examples of the groups (g51) and (g52), for example, the following groups may be mentioned.
—OC(O)—CH=CH₂,
—OC(O)—C(CH₃)=CH₂,
—OC(O)NH—CH₂CH₂—OC(O)—CH=CH₂,
—OC(O)NH—CH₂CH₂—OC(O)—C(CH₃)=CH₂.

As a preferred combination of $Q^3$ and $Z^2$, $Q^3$ is —C(O)O—R³¹—, and $Z^2$ is the group (g52).

The fluorinated polymer (A2) may have units other than the units (u1) and the units (u22) within a range not to impair the effects of the present invention.

As the units other than the units (u1) and the units (u22), for example, units derived from the above-described compound (m3) and the after-mentioned unreacted units (u42) may, for example, be mentioned.

The proportions of the respective units in the fluorinated polymer (A2) are not particularly limited. In view of the balance between the solubility of the fluorinated polymer (A2) in the solvent (D) and the reactivity with the crosslinking agent (B), the proportion of the units (u1) based on all the units (100 mol %) constituting the fluorinated polymer (A2) is preferably from 60 to 95 mol %, particularly preferably from 70 to 90 mol %, and the proportion of the units (u22) is preferably from 5 to 40 mol %, particularly preferably from 10 to 30 mol %.

<Process for Producing Fluorinated Polymer (A2)>

The fluorinated polymer (A2) may be produced, for example, by a process comprising the following step (i) and step (ii).

(i) A step of polymerizing a monomer component containing a compound (m1) and a compound (m5) represented by the following formulae and as the case requires, another monomer, in the presence of a polymerization initiator to obtain a precursor (P2) having units (u1) (units derived from the compound (m1)) and units (u42) (units derived from the monomer (m5)) represented by the following formulae. The monomer other than the monomer (m1) and the monomer (m5) is preferably the monomer (m3).

CX¹¹X¹²=CR¹-Q¹-R^{f1}  (m1),

CX²¹X²²=CR²-Q³-OH  (m5),

  (u1)

  (u42)

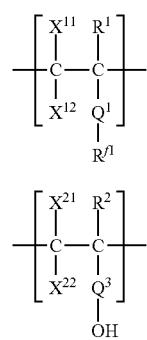

wherein $R^1$, $R^2$, $X^1$, $X^{12}$, $X^{21}$, $X^{22}$, $Q^1$ and $Q^3$ are as defined above.

(ii) A step of reacting the reactive functional group in the above-described compound (m4) and a hydroxy group in the unit (u42) of the precursor (P2) to obtain a fluorinated polymer (A2) having units (u1) and units (u22).

Step (i):

Step (i) is carried out in the same manner as the step (i) in the process for producing fluorinated polymer (A1) except that the compound (m5) is used instead of the compound (m2).

The compound (m5) may, for example, be allyl alcohol or a known (meth)acrylate, vinyl ether, vinyl ester or allyl ether, having a hydroxy group.

Step (ii):

In a case where $Z^2$ is the group (g51), $X^{24}$ in the above described compound (m41) and the hydroxy group in the unit (u42) of the precursor (P2) are reacted in the presence of a basic compound to obtain a fluorinated polymer (A2) having the units (u1) and the units (u22).

In a case where $Z^2$ is the group (g52), the isocyanate group in the above-described a compound (m42) and the hydroxy group in the unit (u42) of the precursor (P2) are reacted in the presence of a urethane-forming catalyst to obtain a fluorinated polymer (A2) having the units (u1) and the units (u22).

In a case where $Z^2$ is the group (g53), $X^{24}$ in the above-described compound (m43) and the hydroxy group in the unit (u42) of the precursor (P2) are reacted in the presence of a basic compound to obtain a fluorinated polymer (A2) having the units (u1) and the units (u22).

In a case where $Z^2$ is the group (g54), $R^{25}$ in the above-described a compound (m44) and the hydroxy group in the unit (u42) of the precursor (P2) are reacted in the presence of a palladium catalyst to obtain a fluorinated polymer (A2) having the units (u1) and the units (u22).

(Crosslinking Agent (B))

The crosslinking agent (B) is a compound having a double bond (excluding the fluororesin (A)). By the reaction of the fluororesin (A) and the crosslinking agent (B), a cured film excellent in the hardness and the solvent resistance is formed.

The double bond in the crosslinking agent (B) undergoes polymerization reaction with the double bond in the fluororesin (A) by radicals generated from the photoinitiator and may form a crosslinked structure.

As the group having a double bond, the same groups as exemplified as the group having a double bond of the fluororesin (A) may be mentioned, and the preferred embodiments are also the same.

The number of the double bond per one molecule of the crosslinking agent (B) is preferably from 2 to 20, particularly preferably from 4 to 8. When the number of the double bond is at least the lower limit value of the above range, the cured film will be more excellent in the hardness and the solvent resistance. When the number of the double bond is at most the upper limit value of the above range, the viscosity of the crosslinking agent (B) tends to be kept low, and when mixed with the fluororesin (A), a uniform photosensitive resin composition is readily obtained.

The number average molecular weight (Mn) of the crosslinking agent (B) is preferably from 140 to 5,000, more preferably from 200 to 3,000, particularly preferably from 250 to 2,500. When the number average molecular weight (Mn) of the crosslinking agent (B) is at least the lower limit value of the above range, the crosslinking agent (B) will hardly volatilize by heating. When the number average molecular weight (Mn) of the crosslinking agent (B) is at most the upper limit value of the above range, the viscosity of the crosslinking agent (B) tends to be kept low, and when mixed with the fluororesin (A), a uniform photosensitive resin composition is readily obtained.

The crosslinking agent (B) is classified into a crosslinking agent having a fluorine atom (hereinafter referred to as a crosslinking agent (B1)) and a crosslinking agent having no fluorine atom (hereinafter referred to as a crosslinking agent (B2)). The crosslinking agent (B) is preferably a crosslinking agent (B1) in view of good compatibility with the fluororesin (A) and excellent smoothness of the surface of the resulting resin film. Further, in view of excellent reactivity of the double bond, more preferred is a crosslinking agent in which at least four atoms other than the fluorine atom (for example, a carbon atom, an oxygen atom and a nitrogen atom) are present between the fluorine atom and the double bond.

The fluorine atom content of the crosslinking agent (B1) is preferably at least 20 mass % in view of good compatibility with the fluororesin (A) and excellent smoothness of the surface of the resin film, and is particularly preferably from 20 to 45 mass % in view of excellent crosslinking property and excellent compatibility with the fluororesin (A).

The crosslinking agent (B1) is preferably an ester of a fluorinated alcohol and (meth)acrylic acid or a reaction product of a fluorinated alcohol and an isocyanate compound having a double bond. The fluorinated alcohol is preferably a dihydric to hexahydric fluorinated alcohol having a high fluorine atom content, more preferably a dihydric to tetrahydric fluorinated alcohol having a high fluorine atom content. Further, the fluorinated alcohol is preferably a fluorinated alcohol having no carbon atom to which a hydrogen atom is bonded, except for the carbon atom to which the hydroxy group is bonded.

The ester of a fluorinated alcohol and (meth)acrylic acid is preferably a polyester having all the hydroxy groups of the fluorinated alcohol substituted with a (meth)acryloyloxy group, and the (meth)acryloyloxy group is preferably an acryloyloxy group.

The isocyanate compound having a double bond is preferably an isocyanate compound having a (meth)acryloyloxy group, and the (meth)acryloyloxy group is preferably an acryloyloxy group. The isocyanate compound having a (meth)acryloyloxy group is preferably a compound having one or two (meth)acryloyloxy groups and one isocyanate group, and the moiety except for the (meth)acryloyloxy group and the isocyanate group is preferably a hydrocarbon group. The hydrocarbon group is preferably an aliphatic hydrocarbon group or an alicyclic hydrocarbon group. The isocyanate compound having an acryloyloxy group may, for example, be specifically 2-isocyanateethyl acrylate or 1,3-bisacryloyloxy-2-methylpropane-2-isocyanate.

As specific compounds which can be used as the crosslinking agent (B1), for example, compounds as disclosed in JP-A-2013-181140 and Japanese Patent No. 4879560 may be mentioned.

As specific examples of the crosslinking agent (B1), for example, compounds (B1-1) to (B1-4) represented by the following formulae may be mentioned.

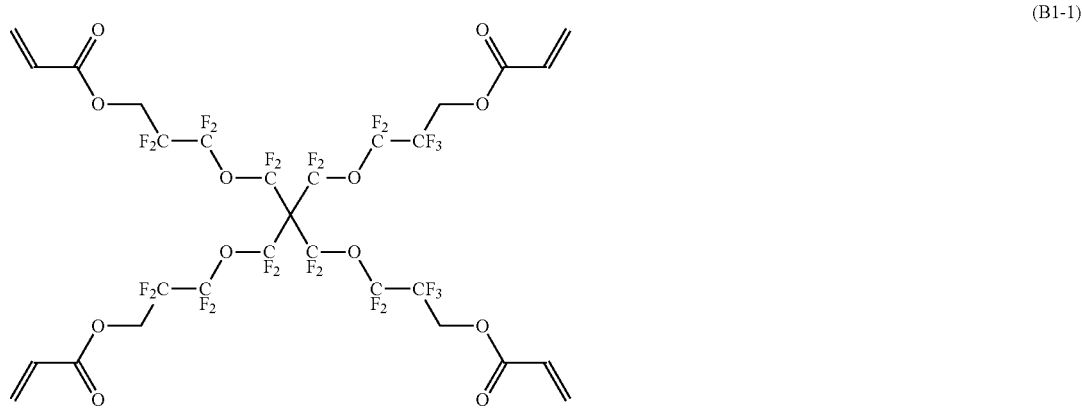

(B1-1)

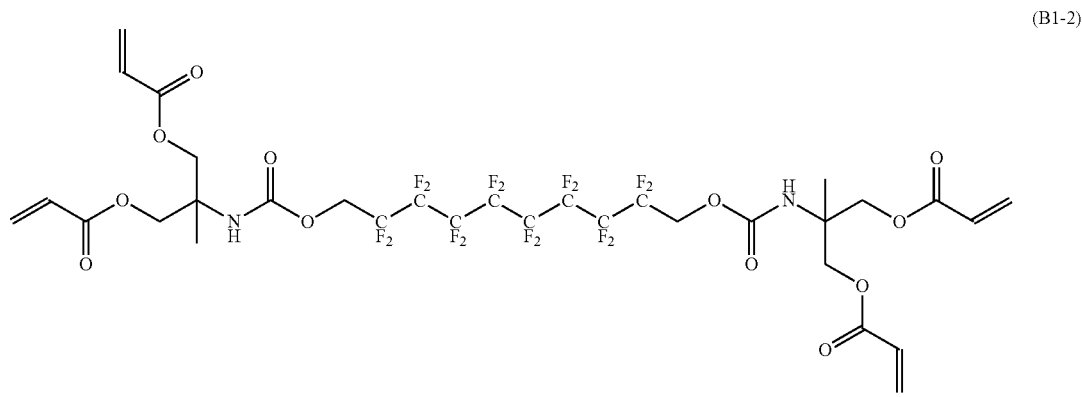

(B1-2)

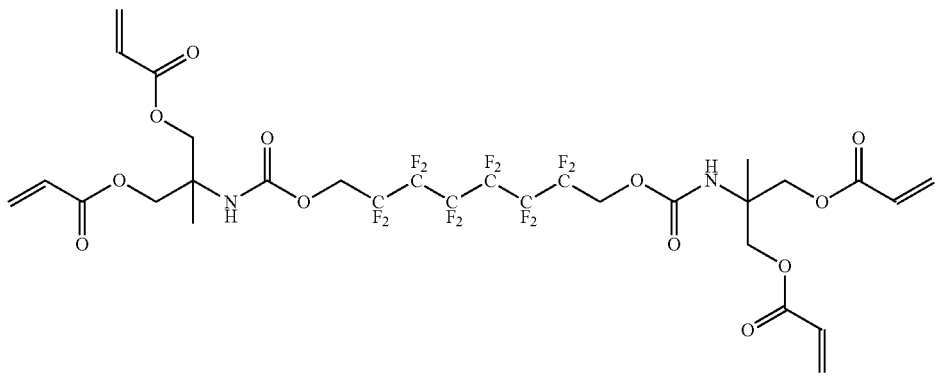

(B1-3)

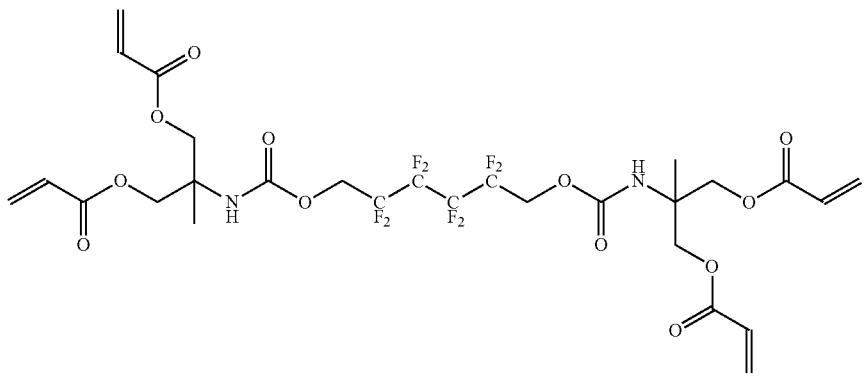

(B1-4)

The fluorine atom contents of the compounds (B1-1) to (B1-4) are as follows.

Compound (B1-1): 44.9 mass %,
Compound (B1-2): 32.3 mass %,
Compound (B1-3): 27.1 mass %,
Compound (81-4): 20.5 mass %.

As specific examples of the crosslinking agent (B2), for example, tris(2-acryloyloxyethyl) isocyanurate, 1,10-decanediol diacrylate, 1,9-nonanediol diacrylate, 1,9-nonanediol dimethacrytate, trimethylolpropane triacrylate, dipentaerythritol hexaacrylate, pentaerythritol tetraacrylate, ditrimethylolpropane tetraacrylate and tricyclodecanedimethanol diacrylate may be mentioned.

(Photoinitiator)

As the photoinitiator, a photo-radical polymerization initiator which generates radicals by absorption of light may be mentioned.

As the photo-radical polymerization initiator, a known initiator may be mentioned. The photo-radical polymerization initiator may be properly selected depending upon the type (e.g. the wavelength) of light. The photo-radical polymerization initiator may, for example, be an oxime ester photopolymerization initiator, an alkylphenone photopolymerization initiator or an acylphosphine oxide photopolymerization initiator.

As specific examples of the photo-radical polymerization initiator, for example, the following may be mentioned.

Oxime ester derivatives: 1,2-octanedione-1-[4-(phenylthio)-2-(o-benzoyloxime)](manufactured by BASF, IRGACURE (registered trademark) OXE01), ethanone 1-[9-ethyl-6-(2-methylbenzoyl)-9H-carbazol-3-yl]-1-(o-acetyloxime) (manufactured by BASF, IRGACURE (registered trademark) OXE02), etc.

α-aminoalkylphenone compound: IRGACURE (registered trademark) 369, IRGACURE (registered trademark) 907, manufactured by BASF, etc.

Acylphosphine oxide compounds: DAROCUR (registered trademark) TPO, etc.

As the photo-radical polymerization initiator, in view of excellent reactivity of radicals to be generated, preferred is IRGACURE (registered trademark) OXE01 or IRGACURE (registered trademark) OXE02.

(Solvent (D))

The solvent (D) is a solvent composed of a fluorinated compound having no aromatic ring, which is liquid at 25° C. The solvent (D) is a compound not reactive with the components contained in the photosensitive resin composition such as the fluororesin (A), the crosslinking agent (B) and the photoinitiator, since it is a solvent.

The solvent (D) is composed of an organic compound having a fluorine atom, having no aromatic ring, and may have an atom other than carbon atoms and fluorine atoms, such as an oxygen atom, a nitrogen atom or a halogen atom other than the fluorine atom. It may or may not have a hydrogen atom. The organic compound having no aromatic ring may, for example be an aliphatic hydrocarbon, an alicyclic hydrocarbon, a non-aromatic alcohol, a non-aromatic ether or a non-aromatic amine, and the solvent (D) is preferably a fluorinated organic compound having some of or all of the hydrogen atoms bonded to the carbon atoms of such an organic compound substituted with fluorine atoms. Further, some of the fluorine atoms may be halogen atoms other than the fluorine atom, such as a chlorine atom.

The solvent (D) may, for example, be a fluorinated aliphatic hydrocarbon compound such as fluorinated decalin, fluorinated cyclohexane, fluorinated hexane, fluorinated octane or fluorinated decane; a fluorinated alkylamine compound such as fluorinated tripentylamine, fluorinated tributylamine or fluorinated tripropylamine; a fluorinated alcohol compound such as fluorinated propanol, fluorinated pentanol, fluorinated heptanol or fluorinated octanol; a fluorinated aliphatic ether compound such as fluorinated butyl methyl ether or fluorinated butyl ethyl ether; or a fluorinated cyclic ether compound such as fluorinated 2-butyltetrahydrofuran.

Further, the solvent (D) is preferably a fluorinated compound having a high fluorine atom content, and the proportion of the number of fluorine atoms based on the total number of fluorine atoms and hydrogen atoms bonded to carbon atoms is preferably at least 50%, more preferably at least 65%. The proportion of the number of fluorine atoms may be 100%. The solvent (D) is preferably a fluorinated compound having hydrogen atoms bonded to carbon atoms (that is, a fluorinated compound having a proportion of the number of fluorine atoms being less than 100%) in view of the solubility of the non-fluorinated material such as the photoinitiator, particularly preferably a fluorinated alcohol compound.

As specific examples of the solvent (D), for example, the following compounds may be mentioned.

1H-tridecafluorohexane (manufactured by Asahi Glass Company, Limited, ASAHIKLIN (registered trademark) AC2000, boiling point: 71° C.), 1,1,1,2,2,3,3,4,4,5,5,6,6-tridecafluorooctane (manufactured by Asahi Glass Company, Limited, ASAHIKLIN (registered trademark) AC6000, boiling point: 115° C.), 1,1,2,2-tetrafluoro-1-(2,2,2-trifluoroethoxy)ethane (manufactured by Asahi Glass Company, Limited, ASAHIKLIN (registered trademark) AE3000, boiling point: 56° C.), a mixture of 1,1-dichloro-2,2,3,3,3-pentafluoropropane and 1,3-dichloro-1,1,2,2,3-pentafluoropropane in a mass ratio of 45:55 (manufactured by Asahi Glass Company, Limited, ASAHIKLIN (registered trademark) AK-225, boiling point: 54° C.), CYTOP (registered trademark) CT-solv100E (manufactured by Asahi Glass Company, Limited, boiling point: 98° C.), 1-methoxynonafluorobutane (manufactured by 3M Japan Limited, Novec (registered trademark) 7100, boiling point: 61° C.), 1-ethoxynonafluorobutane (manufactured by 3M Japan Limited, Novec (registered trademark) 7200, boiling point: 76° C.), 1,1,1,2,3,3-hexafluoro-4-(1,1,2,3,3,3-hexafluoropropoxy)pentane (manufactured by 3M Japan Limited, Novec (registered trademark) 7600, boiling point: 131° C.), 2H,3H-perfluoropentane (manufactured by Du Pont-Mitsui Fluorochemicals Company, Ltd., Vertrel (registered trademark) XF, boiling point: 55° C.), 3,3,4,4,5,5,6,6,7,7,8,8,8-tridecafluoro-1-octanol (boiling point: 80° C.), 4,4,5,5,6,6,7,7,8,8,9,9,9-tridecafluoro-1-nonanol, hexafluoroisopropanol (boiling point: 59° C.), 2,2,3,3,4,4,5,5-octafluoro-1-pentanol (boiling point: 140° C.), 1H,1H,7H-dodecafluoro-1-heptanol (boiling point: 170° C.), 1H,1H,2H,2H-tridecafluoro-1-octanol (boiling point 80° C.), etc.

The boiling point of the solvent (D) is preferably at least 80° C., whereby a resin film excellent in flatness will be obtained, particularly preferably at least 100° C.

The solvent (D) may be used alone or in combination of two or more.

(Component Other than the Above)

The photosensitive resin composition of the present invention may contain a component other than the above (hereinafter referred to as "other component") within a range not to impair the effects of the present invention.

Such other component may, for example, be a photosensitizer, an antioxidant, a thermal polymerization initiator, a thermal polymerization inhibitor, an adhesion-accelerating agent, a leveling agent, a defoaming agent, a suspending agent, a dispersing agent, a plasticizer or a thickener.

In a case where light and heat are used in combination for forming a cured film, a thermal polymerization initiator may be used together with the photoinitiator.

As specific examples of the thermal polymerization initiator, azobisisobutylonitrile, benzoyl peroxide, tert-butyl hydroperoxide, cumene hydroperoxide, di-tert-butyl peroxide and dicumyl peroxide may be mentioned. In view of the decomposition temperature, preferred is azobisisobutylonitrile or benzoyl peroxide.

In a case where the photosensitive resin composition of the present invention contains an adhesion-accelerating agent, more excellent adhesion between the resin film and a layer adjacent to the resin film (such as the organic semiconductor layer) will be obtained.

The adhesion-accelerating agent may, for example, be a silane coupling agent, a titanate coupling agent or an aluminum coupling agent.

(Proportions of the Respective Components)

The solid content concentration of the photosensitive resin composition of the present invention is preferably from 3 to 40 mass %, particularly preferably from 5 to 20 mass %. When the solid content concentration is at least the lower limit value of the above range, a resin film having a film thickness sufficient to obtain insulating properties will be obtained. When the solid content concentration is at most the upper limit value of the above range, the viscosity of the solution is relatively low, and excellent film forming property will be obtained.

The solid content concentration of the photosensitive resin composition of the present invention is a value calculated from the mass of the photosensitive resin composition before heating and the mass after heating by a convection dryer at 120° C. for 4 hours. Further, the concentration of the photosensitive resin composition may be calculated from the amount of the photosensitive resin composition charged.

The proportion of the fluororesin (A) in the photosensitive resin composition of the present invention is preferably from 60 to 90 mass %, particularly preferably from 70 to 90 mass % based on the total amount (100 mass %) of the fluororesin (A) and the crosslinking agent (B). When the proportion of the fluororesin (A) is at least the lower limit value of the above range, a resin film excellent in the low dielectric constant and the low dielectric loss will be obtained. When the proportion of the fluororesin (A) is at most the upper limit value of the above range, a resin film excellent in the hardness and the solvent resistance will be obtained.

The proportion of the crosslinking agent (B) in the photosensitive resin composition of the present invention is preferably from 10 to 40 mass %, particularly preferably from 10 to 30 mass % based on the total amount (100 mass %) of the fluororesin (A) and the crosslinking agent (B). When the proportion of the crosslinking agent (B) is at least the lower limit value of the above range, a resin film excellent in the hardness and the solvent resistance will be obtained. When the proportion of the crosslinking agent (B) is at most the upper limit value of the above range, a resin film excellent in the low dielectric constant and the low dielectric loss will be obtained.

The content of the photoinitiator in the photosensitive resin composition of the present invention is preferably from 1 to 20 parts by mass, particularly preferably from 3 to 15 parts by mass per 100 parts by mass of the total amount of the fluororesin (A) and the crosslinking agent (B). When the content of the photoinitiator is at least the lower limit value of the above range, excellent photo-curing property will be obtained. When the content of the photoinitiator is at most the upper limit value of the above range, the amount of an unreacted photoinitiator contained in the resin film can be suppressed.

The content of other component in the photosensitive resin composition of the present invention is preferably from 0 to 20 parts by mass, particularly preferably from 0 to 10 parts by mass per 100 parts by mass of the total amount of the fluororesin (A) and the crosslinking agent (B). When the content of other component is at most the upper limit value of the above range, a resin film excellent in the low dielectric constant and the low dielectric loss will be obtained.

(Function and Mechanism)

In the above-described photosensitive resin composition of the present invention, since the fluorine atom content of the fluororesin (A) is at least 47 mass %, even when the solvent (D) is used as the solvent, the fluororesin (A) will be sufficiently dissolved in the solvent. Thus, it is not necessary to use an aromatic fluorinated solvent which will damage an organic semiconductor layer composed of an organic compound containing no fluorine atom. And, in the solvent (D), the solubility of an organic compound containing no fluorine atom is very low, and thus the solvent (D) will not damage an organic semiconductor layer composed of an organic compound containing no fluorine atom. Accordingly, the photosensitive resin composition of the present invention will hardly damage an organic semiconductor layer when an insulating film is formed.

Further, from the same reasons, the photosensitive resin composition of the present invention will hardly damage a substrate, when a resin film (such as a liquid repellent film) other than the insulating film is formed on the substrate.

[Resin Film and its Production Process]

The resin film in the present invention is a cured film obtained by applying the photosensitive resin composition of the present invention to a substrate, removing the solvent (D) to form a dry coating film, and exposing and curing the dry film.

The process for producing a resin film of the present invention comprises applying the photosensitive resin composition of the present invention to a substrate, and removing the solvent (D) to form a film, followed by exposure.

As specific examples of the resin film, an insulating film in an organic semiconductor device, a protective film and a liquid-repellent film (such as a water repellent film, an oil repellent film or an antifouling film) in a liquid repellent component may be mentioned, and particularly preferred is an insulating film.

In a case where the resin film is an insulating film or a protective film, the substrate may, for example, be a gate electrode, a source electrode, a drain electrode, an organic semiconductor layer, an organic luminous layer or an organic photoelectric conversion layer. In a case where the resin film is a liquid-repellent film (such as a water repellent film, an oil repellent film or an antifouling film), the substrate may, for example, be a glass plate, a resin plate or a silicon wafer. The substrate is suitably a substrate composed of an organic compound containing no fluorine which is susceptible to damages by an aromatic fluorinated solvent or a non-fluorinated solvent (for example, an organic semiconductor layer, a resin plate, an organic luminous layer or an organic photoelectric conversion layer) in the present invention.

The insulating film composed of a resin film may be a gate insulating film, an interlayer insulating film, or an insulating film other than the gate insulating film and the interlayer insulating film, or a protective film, so long as it is formed on an organic semiconductor layer.

The process for producing a resin film will be described in detail as a process for forming an insulating film in the after-described process for producing an organic semiconductor device of the present invention.

(Function and Mechanism)

The resin film of the present invention is formed by applying the photosensitive resin composition of the present invention which will hardly damage the substrate of e.g. an organic semiconductor layer to a substrate and removing the solvent (D), followed by curing, and accordingly the substrate of e.g. an organic semiconductor layer will hardly be damaged when the resin film containing the fluororesin (A) is formed.

[Organic Semiconductor Device]

The organic semiconductor device of the present invention comprises an insulating film composed of a cured film (resin film) formed by applying the photosensitive resin composition of the present invention to an organic semiconductor layer, and removing the solvent (D) to form a dry coating film, followed by exposure for curing. The process for producing an organic semiconductor device of the present invention will be described later.

First Embodiment

FIG. 1 is a cross-sectional view illustrating a first embodiment of an organic semiconductor device.

An organic semiconductor device 1 comprises a gate electrode 10, a gate insulating film 11 formed on the gate electrode 10, a source electrode 12 and a drain electrode 13 formed on the gate insulating film 11, an organic semiconductor layer 14 formed between the source electrode 12 and the drain electrode 13 on the gate insulating film 11, and an interlayer insulating film 15 formed to cover the source electrode 12, the drain electrode 13 and the organic semiconductor layer 14.

In the interlayer insulating film 15, a hole 16 which reaches from the upper surface of the interlayer insulating film 15 to the drain electrode 13 is formed.

The organic semiconductor device 1 is a bottom gate bottom contact device.

Second Embodiment

Figure 2:
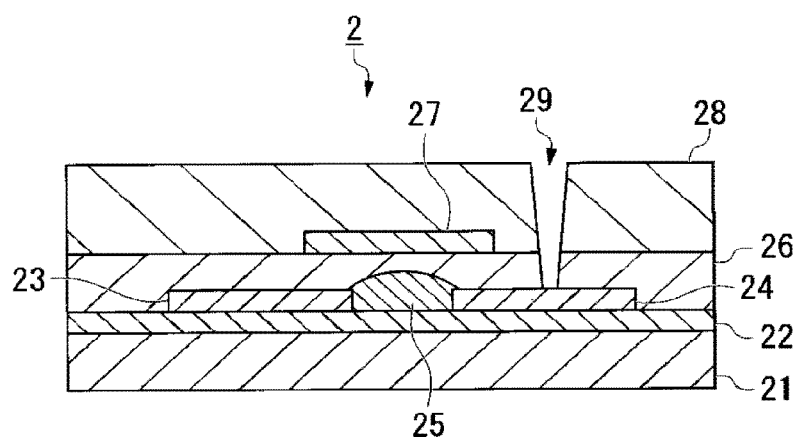
FIG. 2 is a cross-sectional view illustrating another example of an organic semiconductor device.

FIG. 2 is a cross-sectional view illustrating a second embodiment of an organic semiconductor device.

An organic semiconductor device 2 comprises a substrate 21, a primary insulating film 22 formed on the substrate 21, a source electrode 23 and a drain electrode 24 formed on the primary insulating film 22, an organic semiconductor layer 25 formed between the source electrode 23 and the drain electrode 24 on the primary insulating film 22, a gate insulating film 26 formed to cover the source electrode 23, the drain electrode 24 and the organic semiconductor layer 25, a gate electrode 27 formed on the gate insulating film 26, and an interlayer insulating film 28 formed to cover the gate electrode 27 on the gate insulating film 26.

In the gate insulating film 26 and the interlayer insulating film 28, a hole 29 which reaches from the upper surface of the interlayer insulating film 28 to the drain electrode 24 is formed.

The organic semiconductor device 2 is a top gate bottom contact device.

Third Embodiment

Figure 3:
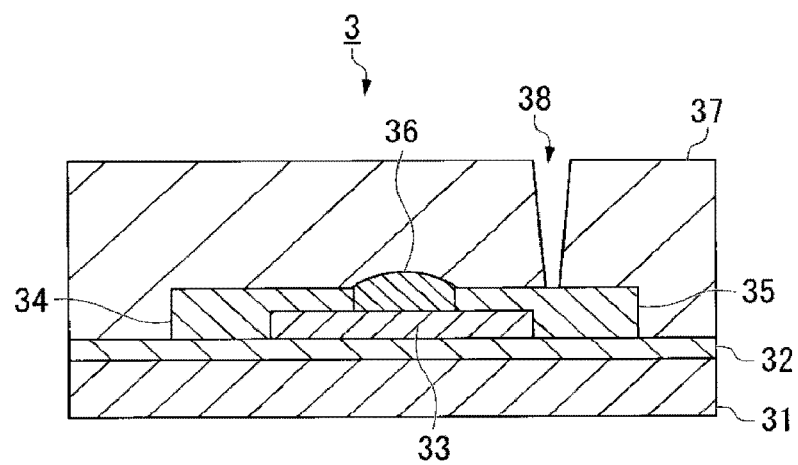
FIG. 3 is a cross-sectional view illustrating another example of an organic semiconductor device.

FIG. 3 is a cross-sectional view illustrating a third embodiment of an organic semiconductor device.

An organic semiconductor device 3 comprises a gate electrode 31, a gate insulating film 32 formed on the gate electrode 31, an organic semiconductor layer 33 formed on the gate insulating film 32, a source electrode 34 and a drain electrode 35 formed on the gate insulating film 32 to face each other via the organic semiconductor layer 33, a protective insulating film 36 formed on the organic semiconductor layer 33, and an interlayer insulating film 37 formed to cover the source electrode 34, the drain electrode 35 and the protective insulating film 36.

In the interlayer insulating film 37, a hole 38 which reaches from the upper surface of the interlayer insulating film 37 to the drain electrode 35 is formed.

The organic semiconductor device 3 is a bottom gate top contact device.

The protective insulating film 36 functions as a sealing layer of the organic semiconductor layer 33. The protective insulating film 36 prevents the organic semiconductor layer 33 from being damaged by the radical polymerization initiator and the solvent in the photosensitive resin composition for forming the interlayer insulating film 37 when the interlayer insulating film 37 is formed.

(Function and Mechanism)

In the above-described organic semiconductor device of the present invention, damages on the organic semiconductor layer when the insulating film is formed are prevented, since the photosensitive resin composition of the present invention which will hardly damage the organic semiconductor layer is applied to the organic semiconductor layer, and the solvent (D) is removed, followed by exposure to form the insulating film (the interlayer insulating film 15 in FIG. 1, the gate insulating film 26 in FIG. 2, the protective insulating film 36 in FIG. 3).

[Process for Producing Organic Semiconductor Device]

The process for producing an organic semiconductor device of the present invention is a process comprising a step of applying the photosensitive resin composition of the present invention to an organic semiconductor layer, and removing the solvent (D) to form a dry coating film, followed by exposure to form an insulating film, and a known process may be employed except that the photosensitive resin composition of the present invention is employed when the insulating film is formed on the organic semiconductor layer. Now, the process for producing an organic semiconductor device of the present invention will be described with reference to an example.

First Embodiment

As a process for producing the organic semiconductor device 1 according to the first embodiment, for example, a process comprising the following steps (α1) to (α4) may be mentioned.

(α1) A step of forming the gate insulating film 11 on the gate electrode 10.

(α2) A step of forming the source electrode 12 and the drain electrode 13 on the gate insulating film 11.

(α3) A step of forming the organic semiconductor layer 14 between the source electrode 12 and the drain electrode 13 on the gate insulating film 11.

(α4) A step of applying the photosensitive resin composition of the present invention to the source electrode 12, the drain electrode 13 and the organic semiconductor layer 14, removing the solvent (D) to form a dry coating film, and exposing the dry coating film to form the interlayer insulating film 15. Further, the interlayer insulating film 15 having the hole 16 is formed by photolithography at the time of exposure.

An organic semiconductor constituting the organic semiconductor layer 14 may be a known low molecular weight compound, oligomer or polymer, and is not particularly limited.

The low molecular weight compound may, for example, be pentacene, rubrene, phthalocyanine, perylene, fullerene or a derivative thereof, or a sulfur-containing compound (e.g. compound (s-1) or compound (s-2) represented by the following formula):

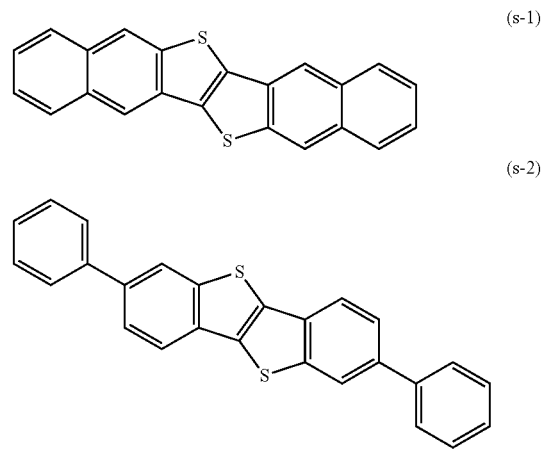

The oligomer may, for example, be oligothiophene or a derivative thereof.

The polymer may, for example, be poly-p-phenylenevinylene, polyfluorene, a fluorene/benzothiadiazole copolymer, a fluorene/triphenylamine copolymer, a fluorene/dithiophene copolymer, polythiophene, polyaniline, polyacetylene, polypyrrole or a derivative thereof.

As a precursor material, silyethyne-substituted pentacene or a tetrabicycloporphyrin derivative may, for example, be mentioned. Such a material may be converted by heating to pentacene or a tetrabenzoporphyrin derivative.

<Step (α4)>

The photosensitive resin composition of the present invention is applied to the source electrode 12, the drain electrode 13 and the organic semiconductor layer 14 to form an undried coating film, the solvent (D) is removed to form a dry coating film, and then the dry coating film is cured by exposure to form the interlayer insulating film 15.

As a method of applying the photosensitive resin composition of the present invention, a known wet coating method may be employed. As a method of removing the solvent (D) in the undried coating film, heating, pressure reduction or a method comprising heating and pressure reduction in combination may, for example, be mentioned.

Heating under normal pressure is preferred in that defects are less likely to occur in the dry coating film, and in view of easy operation. The heating temperature is preferably from 30 to 200° C., particularly preferably from 40 to 150° C.

By using the photosensitive resin composition of the present invention, the hole 16 may be formed in the interlayer insulating film 15 by photolithography.

Specifically, a portion on which the hole 16 is to be formed in the dry coating film is exposed to cure the exposed portion. Then, a non-exposed portion is removed by development with a developer, to form the interlayer insulating film 15 having the hole 16.

By partially exposing the dry coating film, at the exposed portion, crosslinking (curing) between the fluororesin (A) and the crosslinking agent (B) proceeds, and the solubility in the developer decreases. Whereas, at the non-exposed portion, the solubility of the fluororesin (A) in the developer does not change. Accordingly, only the non-exposed portion is removed by developing the resin film after exposure with the developer. In such a manner, an insulating film having a contact hole and the like may be formed by microfabrication by photolithography.

The method of exposing the dry coating film may be an exposure method using an exposure apparatus such as an aligner or a stepper via a mask e.g. by a pressure mode, a vacuum contact mode or a proximity mode.

For exposure, X-rays, ultraviolet rays, visible light and the like including the wavelength absorbed e.g. by the photoinitiator may be employed. As a light source used for exposure, a light source which can emit ultraviolet rays or visible light is preferred, and a ultrahigh pressure mercury arc is particularly preferred.

The radiation dose is properly set depending upon the thickness of the interlayer insulating film 15 and the type of the photoinitiator and the like. For example, in a case where the thickness of the interlayer insulating film 15 is 10 μm, the radiation dose is preferably from 100 to 2,000 mJ/cm$^2$.

After exposure is carried out and before development is carried out, baking (post-exposure baking) may be carried out. By carrying out baking, the reaction rate of a long-life intermediate which is photochemically generated can be increased. Since such an intermediate has an increased mobility during baking, the probability of contact with the reaction site increases by moving, and the reactivity increases. The baking temperature varies depending upon the type of the intermediate, and is preferably from 50 to 250° C. Further, for the same purpose, heating may be carried out during exposure.

Development may be carried out by a known method, for example, by means of a spray, a paddle, dipping or ultrasonic waves.

The developer used for development is a solvent in which the resin at the exposed portion is insoluble or hardly soluble, and the resin at the non-exposed portion is soluble. The developer is preferably a fluorinated solvent, particularly preferably the same solvent as the solvent (D).

After the resin at the non-exposed portion is dissolved by development, as the case requires, the coating film is rinsed with a rinsing liquid and spun (rotated) at high speed for drying.

The rinsing liquid is not particularly limited so long as it is the same as the developer, or it is a liquid in which the solubility of the resin at the non-exposed portion is not so high as in the developer and which is compatible with the developer.

After development or after rinsing, baking for the purpose of removing the developer or the rinsing liquid remaining on the exposed portion may be carried out. Such baking may be carried out e.g. by a hot plate or an oven, and the baking condition is preferably at from 80 to 200° C. for from 0.5 to 60 minutes.

By the production process comprising the above-described steps ($\alpha$1) to ($\alpha$4), the organic semiconductor device 1 can be produced. In the organic semiconductor device 1 obtained by the production process, since the photosensitive resin composition of the present invention containing the solvent (D) is used when the interlayer insulating film 15 is formed on the organic semiconductor layer 14, damages on the organic semiconductor layer 14 can be suppressed. Accordingly, the organic semiconductor device 1 obtained by the production process has excellent properties.

Second Embodiment

As a process for producing the organic semiconductor device 2 according to the second embodiment, for example, a process comprising the following steps ($\beta$1) to ($\beta$6) may be mentioned.

($\beta$1) A step of forming the primary insulating film 22 on the substrate 21.

($\beta$2) A step of forming the source electrode 23 and the drain electrode 24 on the primary insulating film 22.

($\beta$3) A step of forming the organic semiconductor layer 25 between the source electrode 23 and the drain electrode 24 on the primary insulating film 22.

($\beta$4) A step of applying the photosensitive resin composition of the present invention to the source electrode 23, the drain electrode 24 and the organic semiconductor layer 25, removing the solvent (D) to form a dry coating film, and exposing the dry coating film to form the gate insulating film 26. Further, the gate insulating film 15 having the hole 29 is formed by photolithography at the time of exposure.

($\beta$5) A step of forming the gate electrode 27 on the gate insulating film 26.

($\beta$6) A step of forming the interlayer insulating film 28 so as to cover the gate electrode 27 on the gate insulating film 26. As a method for forming the interlayer insulating film 28, a process comprising the above steps ($\alpha$1) to ($\alpha$4) may be mentioned.

<Step ($\beta$4)>

The photosensitive resin composition of the present invention is applied to the source electrode 23, the drain electrode 24 and the organic semiconductor layer 25 to form an undried coating film, and the solvent (D) is removed to form a dry coating film, and the dry coating film is exposed and cured to form the gate insulating film 26.

As a method of applying the photosensitive resin composition of the present invention and a method of removing the solvent (D) in the undried coating film, the same methods as the step ($\alpha$4) in the first embodiment may be mentioned.

By the production process comprising the above-described steps ($\beta$1) to ($\beta$6), the organic semiconductor device 2 can be produced. In the organic semiconductor device 2 obtained by the production process, since the photosensitive resin composition of the present invention containing the solvent (D) is used when the gate insulating film 26 is formed on the organic semiconductor layer 25, damages on the organic semiconductor layer 25 can be suppressed.

Accordingly, the organic semiconductor device 2 obtained by the production process has excellent properties.

Third Embodiment

As a process for producing the organic semiconductor device 3 according to the third embodiment, for example, a process comprising the following steps (γ1) to (γ5) may be mentioned.

(γ1) A step of forming the gate insulating film 32 on the gate electrode 31.

(γ2) A step of forming the organic semiconductor layer 33 on the gate insulating film 32.

(γ3) A step of forming the source electrode 34 and the drain electrode 35 so as to face each other via the organic semiconductor layer 33 on the gate insulating film 32.

(γ4) A step of applying the photosensitive resin composition of the present invention to the organic semiconductor layer 33 and removing the solvent (D) to form a dry coating film, and exposing the dry coating film to form the protective insulating film 36.

(γ5) A step of forming the interlayer insulating film 37 on the source electrode 34, the drain electrode 35 and the organic semiconductor layer 33. As a method of forming the interlayer insulating film 37, a process comprising the above steps (α1) to (α4) may be mentioned. The interlayer insulating film 37 having the hole 38 is formed by photolithography at the time of exposure.

<Step (γ4)>

The photosensitive resin composition of the present invention is applied so as to cover the portion not covered with the source electrode 34 and the drain electrode 35 on the organic semiconductor layer 33 to form an undried coating film, the solvent (D) is removed to form a dry coating film, and the dry coating film is exposed and cured to form the protective insulating film 36.

As a method of applying the photosensitive resin composition of the present invention and a method of removing the solvent (D) in the undried coating film, the same methods as the step (α4) in the first embodiment may be mentioned.

By the production process comprising the above-described steps (γ1) to (γ5), the organic semiconductor device 3 can be produced. In the organic semiconductor device 3 obtained by the production process, since the photosensitive resin composition of the present invention containing the solvent (D) is used when the protective insulating film 36 is formed on the organic semiconductor layer 33, damages on the organic semiconductor layer 33 can be suppressed. Accordingly, the organic semiconductor device 3 obtained by the production process has excellent properties.

Other Embodiment

The process for producing the organic semiconductor device of the present invention was described above with reference to the first to third embodiments, however, the process for producing the organic semiconductor device of the present invention is not limited to such embodiments.

For example, the organic semiconductor devices 1 to 3 according to the first to third embodiments are mere examples which can be produced by the process for producing the organic semiconductor device, and so long as the insulating film on the organic semiconductor layer is formed of the photosensitive resin composition of the present invention, the other aspects are not particularly limited. Specifically, the process for producing the organic semiconductor device of the present invention may be a process for producing a top gate top contact organic semiconductor device.

EXAMPLES

Now, the present invention will be described in further detail with reference to Examples. However, it should be understood that the present invention is by no means restricted thereto.

Ex. 1 to 14 are Production Examples, Ex. 15 to 21 and 25 to 37 are Examples of the present invention, Ex. 22 is a Reference Example, and Ex. 23, 24, 38 to 40 are Comparative Examples.

[Compounds, Abbreviations]

(Compound (m1))

Compound (m1-1): A compound represented by the following formula (m1-1) produced by the process disclosed in Ex. 1 in JP-A-2004-359616:

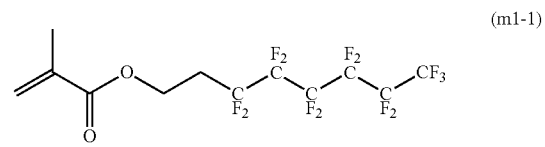 [SMILES: C=C(C)C(=O)OCCC(F)(F)C(F)(F)C(F)(F)C(F)(F)C(F)(F)C(F)(F)F]

Compound (m1-2): A compound represented by the following formula (m1-2) prepared in Ex. 1:

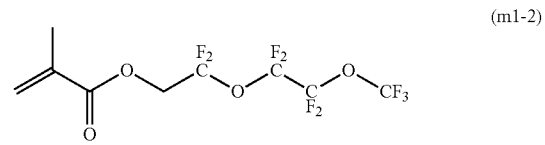 [SMILES: C=C(C)C(=O)OCC(F)(F)OC(F)(F)C(F)(F)OC(F)(F)F]

Compound (m1-3): A compound represented by the following formula (m1-3) prepared in Ex. 2:

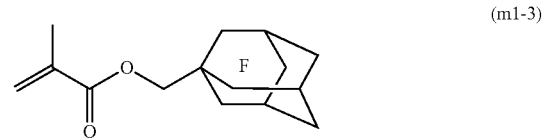

(Compound (m2))

Compound (m2-1): A compound represented by the following formula (m2-1) prepared in Ex. 3:

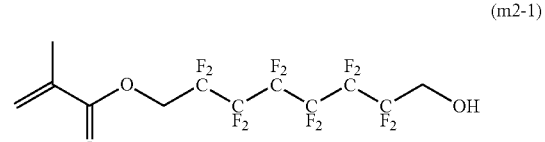

Compound (m2-2): A compound represented by the following formula (m2-2) prepared in Ex. 4:

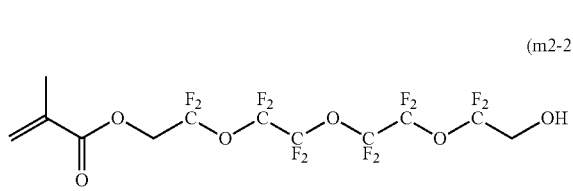
(m2-2)

(Compound (m5))

Compound (m5-1): A compound represented by the following formula (m5-1) (manufactured by JUNSEI CHEMICAL CO., LTD., 2-hydroxyethyl methacrylate):

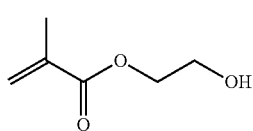
(m5-1)

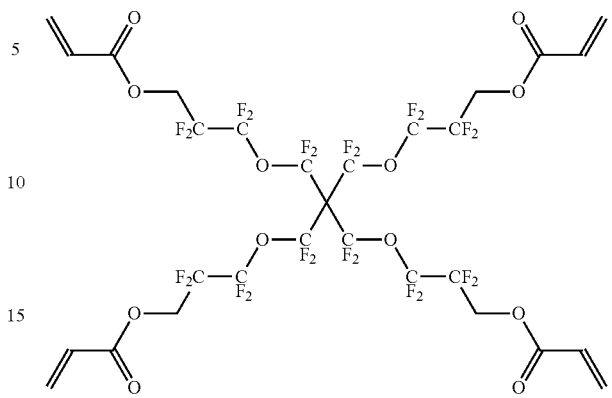
(B1-1)

Compound (B1-3): A compound represented by the following formula (B1-3) produced by the process disclosed in Example 9 in Japanese Patent No. 4,879,560:

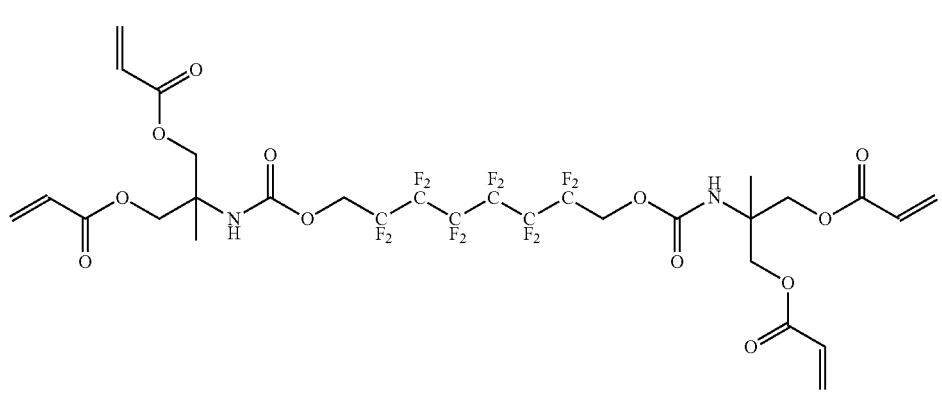
(B1-3)

(Compound (m4))

Compound (m42-1): A compound represented by the following formula (m42-1) (manufactured by Shows Denko K.K., Karenz AOI (registered trademark)):

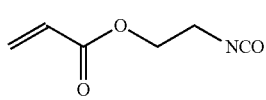
(m42-1)

(Polymerization Initiator)

V65: 2,2'-azobis(2,4-dimethylvaleronitrile) (manufactured by Wako Pure Chemical Industries, Ltd., V-65).

(Crosslinking Agent (B1))

Compound (B1-1): A compound represented by the following formula (β1-1) produced by the process disclosed in Preparation Example 5 in JP-A-2013-181140:

(Crosslinking Agent (B2))

Compound (B2-1): A compound represented by the following formula (B2-1) (manufactured by Shin Nakamura Chemical Co., Ltd., A-TMMT):

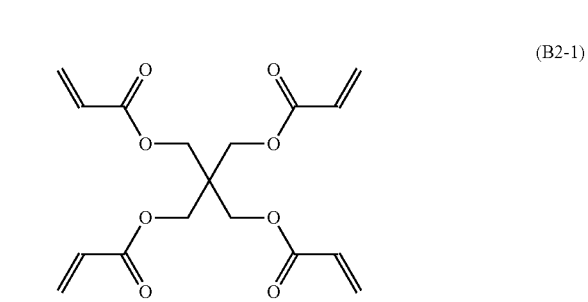 [SMILES: C=CC(=O)OCC(COC(=O)C=C)(COC(=O)C=C)COC(=O)C=C]
(B2-1)

(Photoinitiator)

OXE01: 1,2-octanedione-1-[4-(phenylthio)-2-(o-benzoyloxime)] (manufactured by BASF, IRGACURE (registered trademark) OXE01), OXE02: ethanone 1-[9-ethyl-6-(2-methylbenzoyl)-9H-carbazol-3-yl]-1-(o-acetyloxime) (manufactured by BASF, IRGACURE (registered trademark) OXE02).

(Solvent (D))

OFPO: 1H,1H,5H-octafluoropentanol,

C6 ethanol (C6Et): 1H,1H,2H,2H-tridecafluoro-1-octanol.

(Other Solvent)

HFB: hexafluorobenzene,

Novec 7200: 1-ethoxynonafluorobutane (manufactured by 3M Japan Limited, Novec (registered trademark) 7200), AK-225: a mixture of 1,1-dichloro-2,2,3,3,3-pentafluoropropane and 1,3-dichloro-1,1,2,2,3-pentafluoropropane in a mass ratio of 45:55 (manufactured by Asahi Glass Company, Limited, ASAHIKLIN (registered trademark) AK-225).

(Organic Semiconductor)

Compound (s-1): A compound represented by the following formula (s-1) (manufactured by ALDRICH, dinaphthothienothiophene):

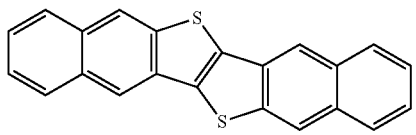

(s-1)

[Physical Properties and Evaluation]

($^1$H-NMR)

The $^1$H-NMR spectrum of a compound was measured by a FT-NMR apparatus (manufactured by JEOL Ltd., JNM-AL300).

(Mass Average Molecular Weight)

The mass average molecular weight (Mw) of a fluororesin or a crosslinking agent was obtained by means of an analytical curve prepared by using a standard polymethyl methacrylate sample having a known molecular weight, from a chromatogram obtained by a high performance gel permeation chromatography (GPC) apparatus (manufactured by Tosoh Corporation, HLC-8220).

(Solubility)

Whether insoluble solid of the photosensitive resin composition remained or not was visually confirmed. A photosensitive resin composition with no insoluble solid was rated as soluble, and a photosensitive resin composition with insoluble solid was rated as insoluble.

(Flatness)

The photosensitive resin composition was applied by spin coating to a surface of a 6 inch silicon wafer (manufactured by Mitsubishi Material Trading Corporation) at 1,000 revolutions/min for 30 seconds, and heated by a hot plate at 60° C. for 60 seconds to form a dry coating film. By using a high pressure mercury lamp as a light source, the dry coating film was exposed with an exposure energy of 1 J/cm$^2$ to cure the dry coating film. In order to accelerate curing of the dry coating film, the dry coating film was baked in a nitrogen atmosphere at 160° C. for 30 minutes to form a cured film. The flatness of the cured film was measured by SURF-CODER (manufactured by Kosaka Laboratory Ltd., ET4000) to determine the arithmetic surface roughness (Ra) as defined in JIS B0601:2001.

(Resolution)

The photosensitive resin composition was applied by spin coating to a surface of a 6 inch silicon wafer (manufactured by Mitsubishi Material Trading Corporation) at 1,000 revolutions/min for 30 seconds and heated by a hot plate at 60° C. for 60 seconds to form a dry coating film. By using a high pressure mercury lamp as a light source, the dry coating film was exposed via a mask (a mask capable of forming a square hole pattern with one side changing from 10 μm to 60 μm at 10 μm intervals) with an exposure energy of 600 mJ/cm$^2$ to cure a part (exposed portion) of the dry coating film. In order to accelerate curing of the dry coating film, the dry coating film was heated by a hot plate at 100° C. for 90 seconds.

The cured film was subjected to dip development for 30 seconds using OFPO as a developer to form a cured film having a hole pattern corresponding to the mask. The cured film was spin-dried at 2,000 revolutions/min for 30 seconds to remove the developer and the rinsing liquid. The thickness of the cured film at a portion not removed by the developer was 0.6 μm.

The cured film was observed with a microscope (manufactured by KEYENCE CORPORATION, VHX DIGITAL MICROSCOPE), and the minimum pattern size with an open hole was taken as the resolution.

(Device Properties)

Figure 4A:
FIGS. 4A-4D are cross sectional views illustrating steps for producing an organic semiconductor device in Examples.
Figure 4A:

As shown in FIG. 4A, the surface of an impurity-added Si substrate (gate electrode 101) (manufactured by RYOKO SANGYO CO., LTD.) having a SiO$_2$ thin film (gate insulating film 102, dielectric constant: 3.9) having a thickness of 100 nm formed on its surface, was treated with trimethoxy(2-phenylethyl)silane to form a self-organized monomolecular film (SAM film 103) to obtain a laminate 104.

Figure 4B:
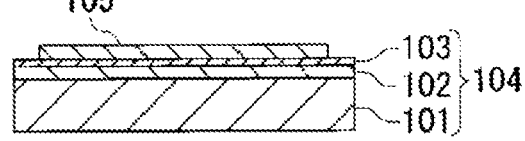
Figure 4B:

As shown in FIG. 4B, compound (s-1) was vacuum deposited (back pressure: at most 10$^{-4}$ Pa, deposition rate: 0.1 Å/sec, substrate temperature: 25° C.) to the surface of the SAM film 103 of the laminate 104 to form an organic semiconductor layer 105 having a thickness of 70 nm.

Figure 4C:
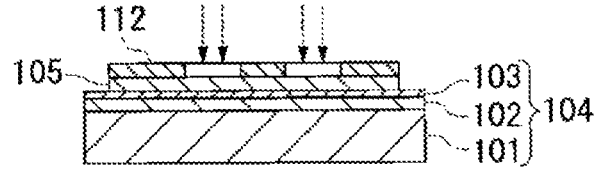
Figure 4C:
Figure 4D:
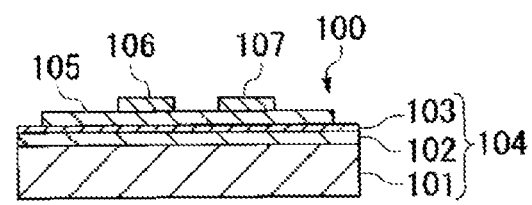

As shown in FIG. 4C, gold was deposited on the organic semiconductor layer 105 through a metal mask 112 so that the channel would be in parallel with the crystal growth direction to form a source electrode 106 and a drain electrode 107 as shown in FIG. 4D to prepare a bottom gate top contact organic semiconductor device 100. The length of the channel was 200 μm and the width of the channel was 2,000 μm.

A voltage changing from +20V to −30V was applied to the gate electrode 101, and a voltage of −30V was further applied to between the source electrode 106 and the drain electrode 107, and an electric current flowing between the source electrode 106 and the drain electrode 107 was measured by a semiconductor device analyzer (manufactured by Agilent Technology). The square root of the obtained on-state current (drain current) and the gate voltage were plotted on a graph, and the carrier mobility μ1 was determined from the gradient.

The photosensitive resin composition was applied by spin coating to the surfaces of the organic semiconductor layer 105, the source electrode 106 and the drain electrode 107 at 1,000 revolutions/min for 30 seconds and heated by a hot plate at 60° C. for 60 seconds to form a dry coating film. By using a high pressure mercury lamp as a light source, the dry coating film was exposed with light having a wavelength of 365 nm with an exposure energy of 100 mJ/cm$^2$ and heated at 100° C. for 90 seconds to form an interlayer insulating film (not shown).

With respect to the organic semiconductor device 100 having the interlayer insulating film formed, the carrier mobility μ2 was obtained in the same manner as the organic semiconductor device 100 before formation of the interlayer insulating film.

A decrease Δμ (%) of the carrier mobility was obtained from the following formula end is taken as the device properties.

$$\Delta\mu = \{(\mu2-\mu1)/\mu1\} \times 1100$$

Ex. 1

Preparation of Compound (m1-2):

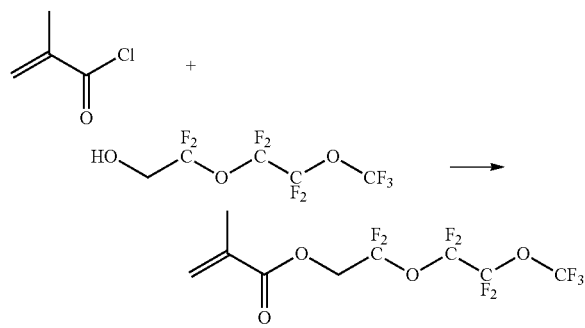

24.3 g of 1H,1H-nonafluoro-3,6-dioxa-1-heptanol and 15.0 g of triethylamine were dissolved in 30 mL of tetrahydrofuran. Under cooling with ice, 15.0 g of methacrylic acid chloride was dropwise added to the solution, followed by stirring at room temperature for 2 hours. 150 mL of ethyl acetate was added, and the mixture was extracted with 150 mL of 1N hydrochloric acid and 150 mL of an aqueous saturated salt solution in this order. The ethyl acetate Layla was dried over magnesium sulfate and ethyl acetate was distilled off. The obtained liquid was purified by vacuum distillation to obtain compound (m1-2).

$^1$H-NMR (300.4 MHz, solvent: CDCl$_3$, standard TMS) δ (ppm): 2.0 (s, 3H), 4.5 (t, 2H), 5.7 (s, 1H), 6.2 (s, 1H).

Ex. 2

Preparation of Compound (m1-3):

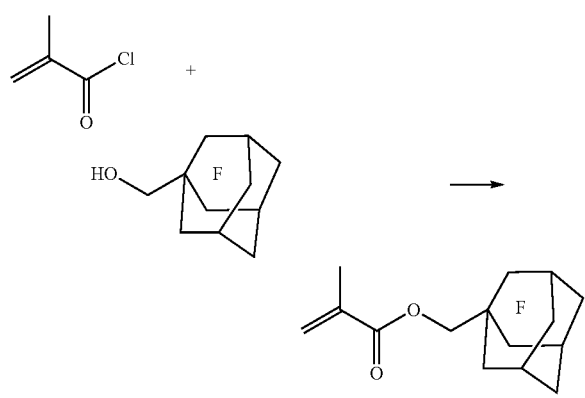

5.0 g of perfluoroadamantylmethanol and 2.0 g of triethylamine were dissolved in 30 g of tert-butyl methyl ether. Under cooling with ice, 1.6 g of methacrylic acid chloride was dropwise added to the solution, followed by stirring at room temperature for 15 hours. The obtained white solid was purified by sublimation to obtain compound (m1-3).

$^1$H-NMR (300.4 MHz, solvent: HFB, standard TMS) δ (ppm): 2.0 (s, 3H), 5.1 (s, 2H), 5.7 (s, 1H), 6.2 (s, 1H).

Ex. 3

Preparation of Compound (m2-1):

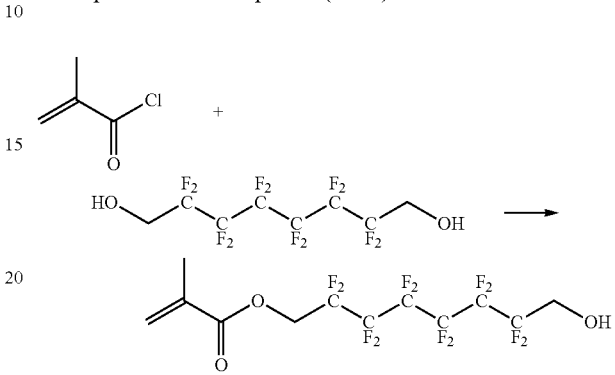

20 g of 1H,1H,8H,8H-dodecafluoro-1,8-octanediol and 11.2 g of triethylamine were dissolved in 30 mL of tetrahydrofuran. Under cooling with ice, 5.8 g of methacrylic acid chloride was dropwise added to the solution, followed by stirring at room temperature for 4 hours. 150 mL of ethyl acetate was added, and the mixture was extracted with 150 mL of 1N hydrochloric acid and 150 mL of an aqueous saturated salt solution in this order. The ethyl acetate layer was dried over magnesium sulfate, and ethyl acetate was distilled off. The remaining liquid was purified by column chromatography (stationary phase: silica, mobile phase: AK-225/ethyl acetate=10/1 (mass ratio)).

$^1$H-NMR (300.4 MHz, solvent: d-acetone, standard: TMS) δ (ppm): 2.0 (s, 3H), 4.1 (t, 2H), 4.9 (t, 2H), 5.8 (s, 1H), 6.2 (s, 1H).

Ex. 4

Preparation of Compound (m2-2):

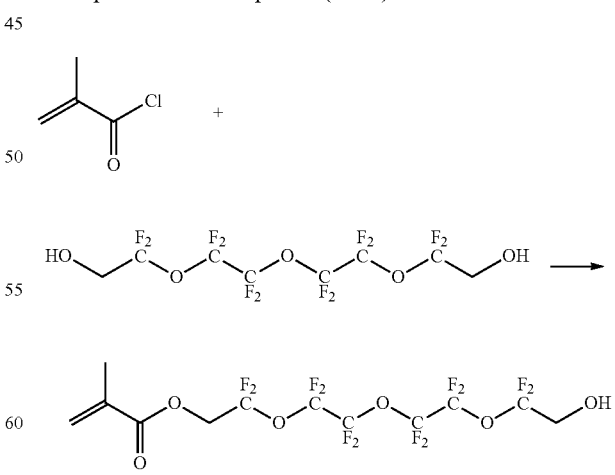

25 g of 2,2,4,4,5,5,7,7,8,8,10,10-dodecafluorotetraethylene glycol and 6.3 g of triethylamine were dissolved in 50 mL of tetrahydrofuran. Under cooling with ice, 6.4 g of methacrylic acid chloride was dropwise added to the solution, followed by stirring at room temperature for 4 hours. 150 mL of ethyl acetate was added, and the mixture was extracted with 150 mL of 1N hydrochloric acid and 150 mL of an aqueous saturated salt solution in this order. The ethyl acetate layer was dried over magnesium sulfate, and ethyl acetate was distilled off. The remaining liquid was purified by column chromatography (stationary phase: silica, mobile phase: AK-225/ethyl acetate=9/1 (mass ratio)).

$^1$H-NMR (300.4 MHz, solvent: d-acetone, standard: TMS) δ (ppm): 2.0 (s, 3H), 4.0 (t, 2H), 4.8 (t, 2H), 5.8 (s, 1H), 6.2 (s, 1H).

Ex. 5

Preparation of Compound (P1-1):

2.7 g of compound (m1-1), 0.3 g of compound (m2-1) and 0.026 g of V65 were dissolved in 27 g of Novec 7200, and the system was replaced with nitrogen, followed by shaking at 50° C. for 24 hours. The reaction liquid was added to 500 mL of hexane, and a precipitated solid was subjected to filtration through a polytetrafluoroethylene (hereinafter sometimes referred to as "PTFE") filter with a pore size of 3 μm, to obtain a copolymer (precursor (P1-1)) comprising units (u1-1)/units (u41-1)=9/1 (mass ratio) and having a mass average molecular weight (Mw) of 82,000.

$^1$H-NMR (300.4 MHz, solvent: hexafluorobenzene, standard: hexafluoroxylene (8.0)) δ (ppm): 3.0 (br, 9H), 4.5 (br, 1H), 4.8 (br, 10H).

Ex. 6 to 14

A precursor was produced in the same manner as in Ex. 5 except that the production conditions were as identified in Table 1. Results of $^1$H-NMR (300.4 MHz, solvent: hexafluorobenzene, standard: hexafluoroxylene (8.0)) measurement of the respective precursors are shown below. In a case where $^1$H-NMR measurement conditions were different, the conditions are also shown.

Precursor (P1-2) δ (ppm): 3.0 (br, 9H), 4.5 (br, 1H), 4.8 (br, 10H).

Precursor (P1-3) δ (ppm): 2.9 (br, 7H), 4.4 (br, 3H), 4.7 (br, 10H).

Precursor (P1-4) δ (ppm): 2.9 (br, 9H), 4.3 (br, 1H), 4.7 (br, 10H).

Precursor (P1-5) δ (ppm): 2.9 (br, 7H), 4.3 (br, 3H), 4.7 (br, 10H).

Precursor (P1-6) δ (ppm): 4.4 (br, 1H), 4.7 (br, 10H).

Precursor (P1-7) δ (ppm): 4.4 (br, 3H), 4.8 (br, 10H).

Precursor (P2-8) δ (ppm): 4.4 (br, 3H), 4.8 (br, 10H).

Precursor (P1-9) $^1$H-NMR (300.4 MHz, solvent: d-acetone, standard: TMS) δ (ppm): 2.7 (br, 3H), 4.1 (br, 7H), 4.3 (br, 3H), 4.7 (br, 7H).

Precursor (P1-10) $^1$H-NMR (300.4 MHz, solvent: d-acetone, standard: TMS) δ (ppm): 4.1 (br, 3H), 4.6 (br, 10H).

TABLE 1

| | Ex. | | 5 | 6 | 7 | 8 | 9 |
|---|---|---|---|---|---|---|---|
| Production conditions | Compound (m1) | Type | (m1-1) | (m1-1) | (m1-1) | (m1-1) | (m1-1) |
| | | Amount [g] | 2.7 | 2.7 | 1.75 | 2.7 | 2.0 |
| | Compound (m2) | Type | (m2-1) | (m2-1) | (m2-1) | (m2-2) | (m2-2) |
| | | Amount [g] | 0.3 | 0.3 | 0.75 | 0.3 | 0.97 |
| | Compound (m5) | Type | — | — | — | — | — |
| | | Amount [g] | — | — | — | — | — |
| | V65 | | 0.026 | 0.026 | 0.022 | 0.026 | 0.025 |
| | Solvent | Type | Novec 7200 | AK-225 | 2-butanone | AK-225 | AK-225 |
| | | Amount [g] | 27 | 27 | 22.5 | 27 | 27 |
| Precursor | Type | | (P1-1) | (P1-2) | (P1-3) | (P1-4) | (P1-5) |
| | Unit (u1) | Type | (u1-1) | (u1-1) | (u1-1) | (u1-1) | (u1-1) |
| | | Mole fraction [%] | 90 | 90 | 70 | 90 | 70 |
| | Unit (u41), (u42) | Type | (u41-1) | (u41-1) | (u41-1) | (u41-2) | (u41-2) |
| | | Mole fraction [%] | 10 | 10 | 30 | 10 | 30 |
| | Mass average molecular weight (Mw) | | 82,000 | 45,000 | 19,000 | 46,000 | 45,000 |

| | Ex. | | 10 | 11 | 12 | 13 | 14 |
|---|---|---|---|---|---|---|---|
| Production conditions | Compound (m1) | Type | (m1-2) | (m1-3) | (m1-1) | (m1-1) | (m1-2) |
| | | Amount [g] | 2.64 | 185 | 2.9 | 0.75 | 1.96 |
| | Compound (m2) | Type | (m2-1) | (m2-1) | — | (m2-1) | (m2-1) |
| | | Amount [g] | 0.36 | 0.65 | — | 1.75 | 104 |
| | Compound (m5) | Type | — | — | (m5-1) | — | — |
| | | Amount [g] | — | — | 1.0 | — | — |
| | V65 | | 0.031 | 0.019 | 0.028 | 0.036 | 0.030 |
| | Solvent | Type | AK-225 | AK-225 | AK-225 | AK-225 | AK-225 |
| | | Amount [g] | 27 | 22.5 | 27 | 22.5 | 27 |
| Precursor | Type | | (P1-6) | (P1-7) | (P2-8) | (P1-9) | (P1-10) |
| | Unit (u1) | Type | (u1-2) | (u1-3) | (u1-1) | (u1-1) | (u1-2) |
| | | Mole fraction [%] | 90 | 90 | 90 | 30 | 70 |
| | Unit (u41), (u42) | Type | (u41-1) | (u41-1) | (u42-1) | (u41-1) | (u41-1) |
| | | Mole fraction [%] | 10 | 10 | 10 | 70 | 30 |
| | Mass average molecular weight (Mw) | | 24,000 | 10,000 | 76,000 | 32,000 | 11,000 |

Ex. 15

Production of Fluororesin (A1-1):

1.5 g of precursor (P1-1), 0.2 mg of dibutyltin dilaurate and 2.45 mg of benzohydroxytoluene were dissolved in 13.5 g of Novec 7200, and 0.05 g of compound (m42-1) was added, followed by shaking at 40° C. for 24 hours. The reaction liquid was added to 300 mL of hexane, and a precipitated solid was subjected to filtration through a PTFE filter having a pore size of 3 μm to obtain fluororesin (A1-1) having units (u1-1) and units (u21-1). The results are shown in Table 2.

$^1$H-NMR (300.4 MHz, solvent: hexafluorobenzene, standard: hexafluoroxylene (8.0)) δ (ppm): 2.9 (br, 8H), 3.8 (br, 1H), 4.3 (br, 2H), 4.7 (br, 10H), 5.8 to 6.5 (m, 2H).

Ex. 16 to 24

A fluororesin was produced in the same manner as in Ex. 15 except that the production conditions were as identified in Table 2. The results are shown in Table 2. Results of $^1$H-NMR (300.4 MHz, solvent: hexafluorobenzene, standard: hexafluoroxylene (8.0)) measurement of the respective fluororesins are shown below. In a case where $^1$H-NMR measurement conditions were differed, the conditions are also shown.

Fluororesin (A1-2) δ (ppm): 2.9 (br, 9H), 3.8 (br, 1H), 4.3 (br, 2H), 4.7 (br, 10H), 5.8 to 6.5 (m, 2H).

Fluororesin (A1-3) δ (ppm): 2.9 (br, 7H), 3.8 (br, 2H), 4.3 (br, 3H), 4.7 (br, 10H), 5.8 to 6.5 (m, 2H).

Fluororesin (A1-4) δ (ppm): 2.9 (br, 9H), 3.8 (br, 1H), 4.3 (br, 1H), 4.7 (br, 10H), 5.8 to 6.5 (m, 2H).

Fluororesin (A1-5) δ (ppm): 2.9 (br, 7H), 3.8 (br, 2H), 4.3 (br, 1H), 4.5 (br, 2H), 4.7 (br, 10H), 5.8 to 6.5 (m, 4H).

Fluororesin (A1-6) δ (ppm): 3.6 (br, 1H), 3.8 (br, 1H), 4.3 (br, 2H), 4.5 (br, 2H), 4.8 (br, 10H), 6.1 to 6.6 (m, 1H).

Fluororesin (A1-7) δ (ppm): 3.7 (br, 2H), 4.4 (br, 2H), 4.9 (br, 9H), 5.2 (br, 10H), 6.1 to 6.6 (m, 5H).

Fluororesin (A2-8) δ (ppm): 2.9 (br, 9H), 3.7 (br, 1H), 4.5 (br, 3H), 4.7 (br, 10H), 6.1 to 6.6 (m, 2H).

Fluororesin (X-9) $^1$H-NMR (300.4 MHz, solvent: d-acetone, standard: TMS) δ (ppm): 2.7 (br, 4H), 3.4 (q, 6H), 4.1 (m, 15H), 4.3 (br, 3H), 4.7 (br, 10H), 5.2 (br, 10H), 5.9 to 6.4 (m, 10H).

Fluororesin (X-10) δ (ppm): 3.6 (q, 1H), 3.8 (m, 1H), 4.4 (br, 4H), 4.8 (br, 10H), 6.1 to 6.7 (m, 1H).

TABLE 2

| | Ex. | | 15 | 16 | 17 | 18 | 19 |
|---|---|---|---|---|---|---|---|
| Production conditions | Precursor | Type | (P1-1) | (P1-2) | (P1-3) | (P1-4) | (P1-5) |
| | | Amount [g] | 1.5 | 1.5 | 1.0 | 1.3 | 1.3 |
| | Dibutyltin dilaurate | Amount [mg] | 0.2 | 0.2 | 0.4 | 0.17 | 0.5 |
| | Benzohydroxytoluene | Amount [mg] | 2.45 | 2.45 | 4 | 2 | 6 |
| | Solvent | Type | Novec 7200 | AK-225 | AK-225 | AK-225 | AK-225 |
| | | Amount [g] | 13.5 | 13.5 | 9.0 | 11.7 | 11.7 |
| | Compound (m4) | Type | (m42-1) | (m42-1) | (m42-1) | (m42-1) | (m42-1) |
| | | Amount [g] | 0.05 | 0.05 | 0.1 | 0.04 | 0.12 |
| Fluororesin | Type | | (A1-1) | (A1-2) | (A1-3) | (A1-4) | (A1-5) |
| | Unit (u1) | Type | (u1-1) | (u1-1) | (u1-1) | (u1-1) | (u1-1) |
| | | Mole fraction [%] | 90 | 90 | 70 | 90 | 70 |
| | Unit (u21), (u22) | Type | (u21-1) | (u21-1) | (u21-1) | (u21-2) | (u21-2) |
| | | Mole fraction [%] | 10 | 10 | 30 | 10 | 30 |
| | Fluorine atom content [mass %] | | 55 | 55 | 52 | 55 | 51 |
| | Mass average molecular weight (Mw) | | 90,000 | 48,000 | 20,000 | 46,000 | 50,000 |

| | Ex. | | 20 | 21 | 22 | 23 | 24 |
|---|---|---|---|---|---|---|---|
| Production conditions | Precursor | Type | (P1-6) | (P1-7) | (P2-8) | (P1-9) | (P1-10) |
| | | Amount [g] | 1.4 | 2.0 | 3.0 | 1.0 | 15 |
| | Dibutyltin dilaurate | Amount [mg] | 0.2 | 0.7 | 0.4 | 0.9 | 0.7 |
| | Benzohydroxytoluene | Amount [mg] | 3 | 9 | 5.3 | 11 | 8.5 |
| | Solvent | Type | AK-225 | AK-225 | AK-225 | 2-butanone | 2-butanone |
| | | Amount [g] | 11.7 | 18 | 27 | 9 | 13.5 |
| | Compound (m4) | Type | (m42-1) | (m42-1) | (m42-1) | (m42-1) | (m42-1) |
| | | Amount [g] | 0.06 | 0.18 | 0.11 | 0.23 | 0.17 |
| Fluororesin | Type | | (A1-6) | (A1-7) | (A2-8) | (X-9) | (X-10) |
| | Unit (u1) | Type | (u1-2) | (u1-3) | (u1-1) | (u1-1) | (u1-2) |
| | | Mole fraction [%] | 90 | 70 | 90 | 30 | 70 |
| | Unit (u21), (u22) | Type | (u21-1) | (u21-1) | (u22-1) | (u21-1) | (u21-1) |
| | | Mole fraction [%] | 10 | 30 | 10 | 70 | 30 |
| | Fluorine atom content [mass %] | | 48 | 52 | 51 | 35 | 46 |
| | Mass average molecular weight (Mw) | | 21,000 | 14,000 | 78,000 | 32,000 | 11,000 |

The units of the precursors and the fluororesins obtained in Examples are shown below.
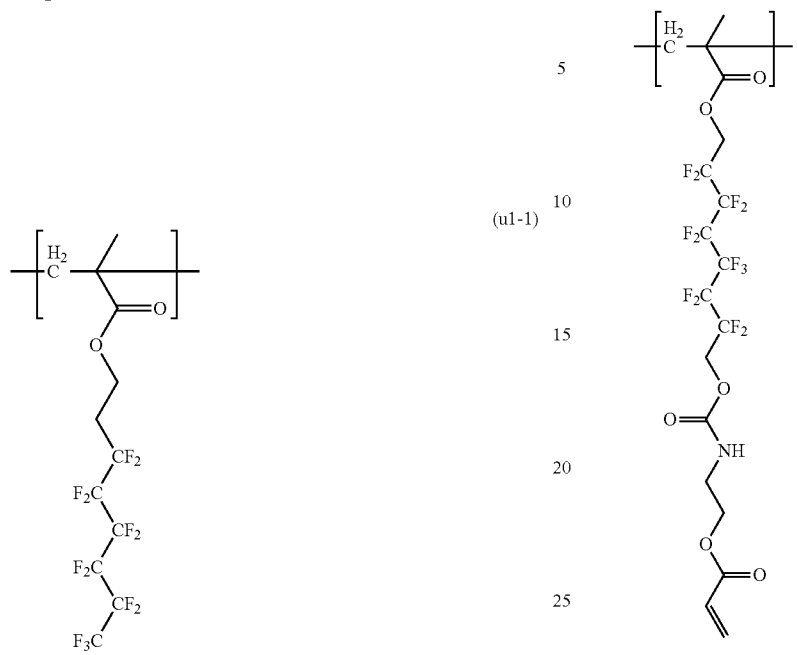
(u1-1)
(u1-2)
(u1-3)
-continued
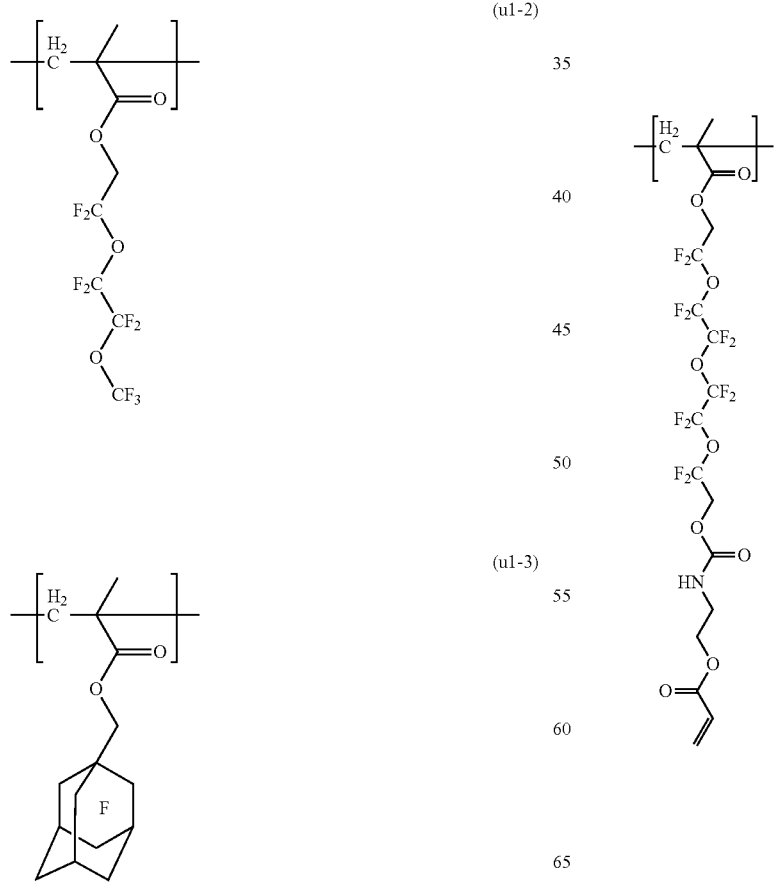
(u21-1)
(u21-2)

-continued

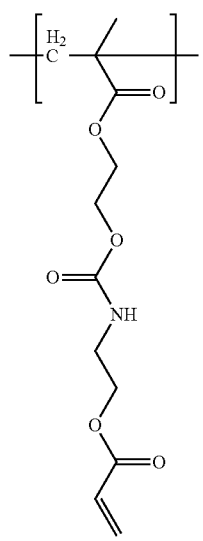
(u22-1)

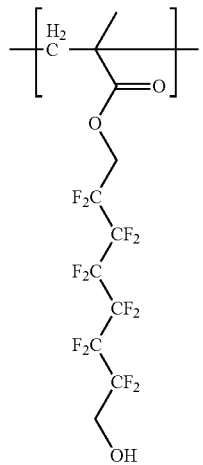
(u41-1)

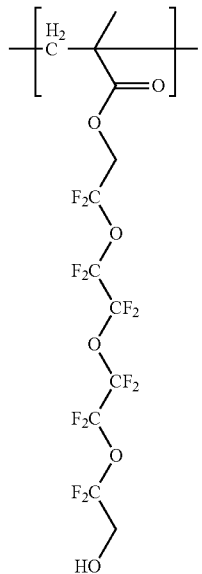
(u41-2)

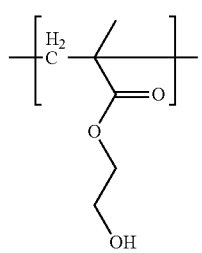
(u42-1)

Ex. 25

0.30 g of fluororesin (A1-1), 0.20 g of compound (81-3), 0.05 g of OXE02 and 4.25 g of OFPO were put in a glass vial (20 mL) and sufficiently stirred to obtain a uniform solution. The obtained solution was subjected to filtration through a PTFE filter having a pore size of 0.20 μm to prepare a photosensitive resin composition. Using the photosensitive resin composition, various evaluations were conducted. The results are shown in Table 3.

Ex. 26 to 40

Photosensitive resin compositions in Ex. 26 to 40 were prepared in the same manner as in Ex. 25 except that the type or the amount of each component was changed. Using the photosensitive resin compositions, various evaluations were conducted. The results are shown in Table 3.

TABLE 3

| | Fluororesin | | Crosslinking agent | | Photoinitiator | | | | | | |
|---|---|---|---|---|---|---|---|---|---|---|---|
| Ex. | Type | Amount [parts by mass] | Type | Amount [parts by mass] | Type | Amount [parts by mass] | Solvent | Solubility | Flatness [nm] | Resolution [μm] | Device properties |
| 25 | A1-1 | 60 | B1-3 | 40 | OXE02 | 10 | OFPO | Soluble | 3 | 40 | 0% |
| 26 | A1-2 | 60 | B1-3 | 40 | OXE02 | 10 | OFPO | Soluble | 2 | 20 | −2% |
| 27 | A1-2 | 60 | B1-3 | 40 | OXE02 | 10 | C6Et | Soluble | 2 | 40 | +2% |
| 28 | A1-2 | 60 | B1-3 | 40 | OXE01 | 10 | OFPO | Soluble | 2 | 30 | +5% |
| 29 | A1-2 | 80 | B1-3 | 20 | OXE02 | 10 | OFPO | Soluble | 2 | 40 | +5% |
| 30 | A1-2 | 60 | B2-1 | 40 | OXE02 | 10 | OFPO | Soluble | 27 | 40 | −3% |
| 31 | A1-2 | 60 | B1-1 | 40 | OXE02 | 10 | OFPO | Soluble | 3 | 40 | 0% |
| 32 | A1-3 | 60 | B1-3 | 40 | OXE02 | 10 | OFPO | Soluble | 3 | 40 | +4% |

TABLE 3-continued

| | Fluororesin | | Crosslinking agent | | Photoinitiator | | | | | | |
|---|---|---|---|---|---|---|---|---|---|---|---|
| Ex. | Type | Amount [parts by mass] | Type | Amount [parts by mass] | Type | Amount [parts by mass] | Solvent | Solubility | Flatness [nm] | Resolution [µm] | Device properties |
| 33 | A1-4 | 60 | B1-3 | 40 | OXE02 | 10 | OFPO | Soluble | 3 | 30 | 0% |
| 34 | A1-5 | 60 | B1-3 | 40 | OXE02 | 10 | OFPO | Soluble | 5 | 40 | 0% |
| 35 | A1-6 | 60 | B1-3 | 40 | OXE02 | 10 | OFPO | Soluble | 6 | 40 | +2% |
| 36 | A1-7 | 60 | B1-3 | 40 | OXE02 | 10 | OFPO | Soluble | 1 | 40 | −2% |
| 37 | A2-8 | 60 | B1-3 | 40 | OXE02 | 10 | OFPO | Soluble | 18 | 40 | −4% |
| 38 | A1-2 | 60 | B1-3 | 40 | OXE01 | 10 | HFB | Soluble | 2 | 20 | −70% |
| 39 | X-9 | 60 | B1-3 | 40 | OXE02 | 10 | OFPO | Insoluble | — | — | — |
| 40 | X-10 | 60 | B1-3 | 40 | OXE02 | 10 | OFPO | Insoluble | — | — | — |

In Ex. 25 to 37, since a fluororesin (A) having a fluorine atom content of at least 47 mass % and a solvent (D) were used, excellent solubility, resolution and device properties were achieved.

Particularly in Ex. 25 to 29 and 31 to 36, since a fluorinated polymer (A1) having a specific structure and a crosslinking agent (B1) having a fluorine atom content of at least 20 mass % were used, excellent flatness was also achieved.

In Ex. 38, although a fluororesin (A) was used, since an aromatic fluorinated solvent was used, the device properties were poor.

In Ex. 39 and 40, since a fluororesin (X) having a fluorine atom content of less than 47 mass % was used, the solubility in a solvent (D) was poor.

INDUSTRIAL APPLICABILITY

The photosensitive resin composition of the present invention is useful as a coating material for forming a resin film containing a fluororesin on a substrate of e.g. an organic semiconductor layer which is susceptible to damages by an aromatic fluorinated solvent or a non-fluorinated solvent. Specifically, it may, for example, be an insulating film-forming composition for forming an insulating film in an organic semiconductor device, a protective film-forming composition for forming a protective film in an organic semiconductor device or an organic light-emitting diode, or a liquid repellent film-forming composition for forming a liquid repellent film (such as a water repellent film, an oil repellent film or an antifouling film, specifically, a liquid repellent insulating film of an electrowetting device or lyophilic/liquid repellent patterning comprising a lyophilic part and a liquid repellent part) on a substrate, and is particularly preferably an insulating film-forming composition.

According to the process for producing an organic semiconductor device of the present invention, damages on an organic semiconductor layer in the production process can be suppressed, and an organic semiconductor device having excellent properties can be obtained. The organic semiconductor device may be used as e.g. an organic thin film transistor (TFT) device or a field-effect transistor (FET) device for electronic equipment such as a liquid crystal television, an organic EL television, electronic paper or RF-ID.

This application is a continuation of PCT Application No. PCT/JP2016/053070, filed on Feb. 2, 2016, which is based upon and claims the benefit of priority from Japanese Patent Application No. 2015-021586 filed on Feb. 5, 2015. The contents of those applications are incorporated herein by reference in their entireties.

REFERENCE SYMBOLS

1: organic semiconductor device, 2: organic semiconductor device, 3: organic semiconductor device, 10: gate electrode, 11: gate insulating film, 12: source electrode, 13: drain electrode, 14: organic semiconductor layer, 15: interlayer insulating film, 16: hole, 21: substrate, 22: primary insulating film, 23: source electrode, 24: drain electrode, 25: organic semiconductor layer, 26: gate insulating film, 27: gate electrode, 28: interlayer insulating film, 29: hole, 31: gate electrode, 32: gate insulating film, 33: organic semiconductor layer, 34: source electrode, 35: drain electrode, 36: protective insulating film, 37: interlayer insulating film, 38: hole, 100: organic semiconductor device, 101: gate electrode, 102: gate insulating film, 103: SAM film, 104: laminate, 105: organic semiconductor layer, 106: source electrode, 107: drain electrode, 112: metal mask

What is claimed is:

1. A photosensitive resin composition, comprising:
a fluororesin having a polymerizable carbon-carbon double bond and having a fluorine atom content of at least 47 mass %;
a crosslinking agent having a polymerizable carbon-carbon double bond, excluding the fluororesin; and
a solvent composed of a fluorinated compound having no aromatic ring, which is liquid at 25° C.,
wherein the fluororesin is composed of a copolymer having units of formula (u1) and units of formula (u21):

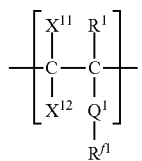

(u1)

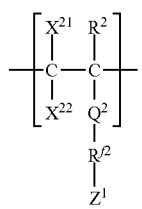

(u21)

wherein each of $R^1$ and $R^2$ is independently a hydrogen atom, a methyl group, an ethyl group or a halogen atom,
each of $X^{11}$, $X^{12}$, $X^{21}$ and $X^{22}$ is independently a hydrogen atom or a halogen atom, each of $Q^1$ and $Q^2$ is independently a bivalent linking group,
$R^{f1}$ is a $C_{1\text{-}10}$ perfluoroalkyl group or a $C_{2\text{-}10}$ perfluoroalkyl group having an etheric oxygen atom between carbon-carbon atoms,
$R^{f2}$ is a $C_{1\text{-}10}$ perfluoroalkylene group or a $C_{2\text{-}10}$ perfluoroalkylene group having an etheric oxygen atom between carbon-carbon atoms, and
$Z^1$ is a monovalent organic group having a polymerizable carbon-carbon double bond.

2. The photosensitive resin composition according to claim 1, wherein the crosslinking agent is a crosslinking agent having fluorine atoms, having a fluorine atom content of at least 20 mass %.

3. The photosensitive resin composition according to claim 1, which has a solid content concentration of from 3 to 40 mass %.

4. The photosensitive resin composition according to claim 1,
wherein based on the total amount (100 mass %) of the fluororesin and the crosslinking agent, a proportion of the fluororesin is from 60 to 90 mass %, and a proportion of the crosslinking agent is from 10 to 40 mass %.

5. The photosensitive resin composition according to claim 1,
wherein the solvent is a fluorinated aliphatic hydrocarbon compound, a fluorinated alkylamine compound, a fluorinated alcohol compound, a fluorinated aliphatic ether compound or a fluorinated cyclic ether compound.

6. The photosensitive resin composition according to claim 1,
wherein the solvent has a boiling point of at least 80° C.

7. An insulating film, comprising:
the photosensitive resin composition of claim 1.

8. A method for producing a resin film, the method comprising:
applying the photosensitive resin composition as defined in claim 1 to a substrate, and removing the solvent to form a film, followed by exposure.

9. A method for producing an organic semiconductor device, the method comprising:
applying the photosensitive resin composition as defined in claim 1 to an organic semiconductor layer, and
removing the solvent, followed by exposure to form an insulating film.

10. The photosensitive resin composition of claim 1, wherein the crosslinking agent has 2 to 20 double bonds per one molecule of the crosslinking agent.

11. The photosensitive resin composition of claim 1, wherein the crosslinking agent has a number average molecular weight (Mn) of from 140 to 5,000.

12. The photosensitive resin composition of claim 1, wherein the crosslinking agent has a fluorine atom content ranging from 20 to 45 mass %.

13. The photosensitive resin composition of claim 1, wherein the crosslinking agent is an ester of a fluorinated alcohol and (meth)acrylic acid or a reaction product of a fluorinated alcohol and an isocyanate compound having a double bond.

14. The photosensitive resin composition of claim 1, wherein the crosslinking agent is a compound (B1-1), (B1-2), (B1-3), or (B1-4):

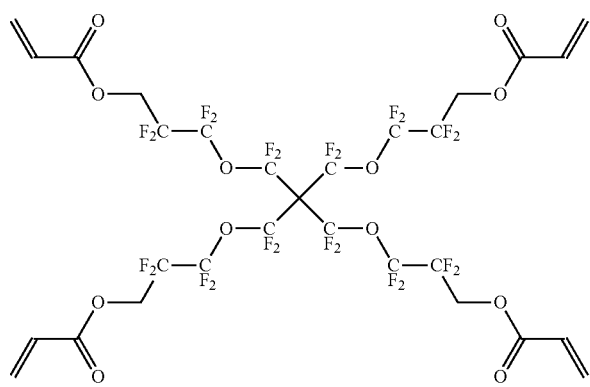

(B1-1)

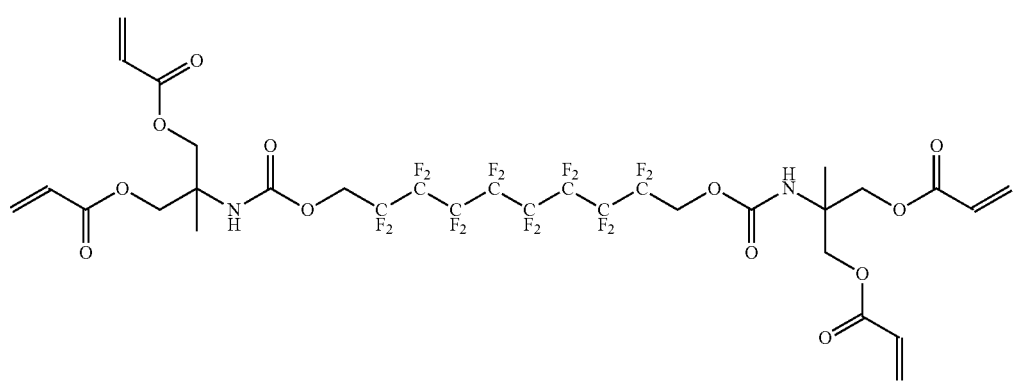

(B1-2)

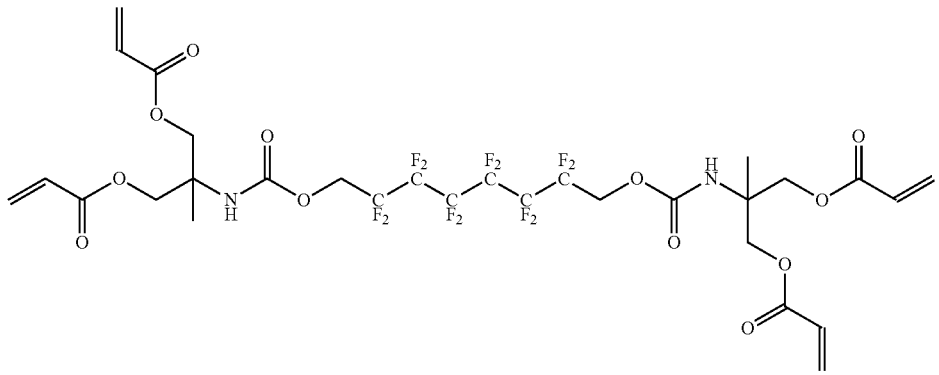

(B1-3)

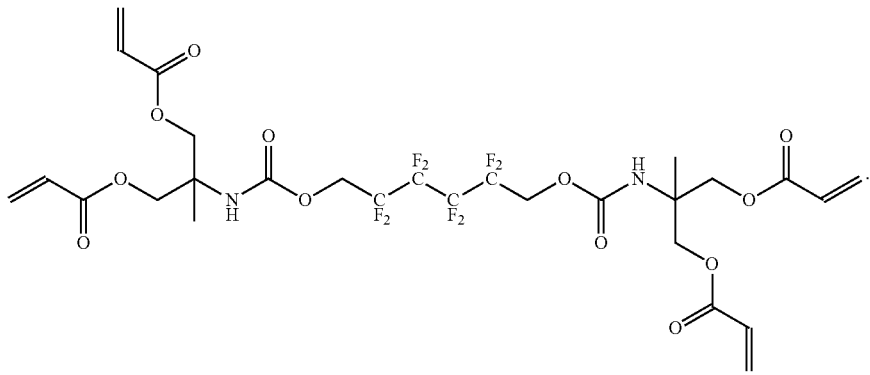

(B1-4)

15. The photosensitive resin composition of claim 1, wherein the crosslinking agent is selected from the group consisting of tris(2-acryloyloxyethyl) isocyanurate, 1,10-decanediol diacrylate, 1,9-nonanediol diacrylate, 1,9-nonanediol dimethacrylate, trimethylolpropane triacrylate, dipentaerythritol hexaacrylate, pentaerythritol tetraacrylate, ditrimethylolpropane tetraacrylate and tricyclodecanedimethanol diacrylate.

16. The photosensitive resin composition of claim 1, wherein the solvent is selected from the group consisting of fluorinated decalin, fluorinated cyclohexane, fluorinated hexane, fluorinated octane, fluorinated decane, fluorinated tripentylamine, fluorinated tributylamine, fluorinated tripropylamine, fluorinated propanol, fluorinated pentanol, fluorinated heptanol, fluorinated octanol, fluorinated butyl methyl ether, fluorinated butyl ethyl ether, and fluorinated 2-butyltetrahydrofuran.

17. The photosensitive resin composition of claim 1, wherein the solvent comprises a fluorinated compound having a proportion of the number of fluorine atoms based on the total number of fluorine atoms and hydrogen atoms bonded to carbon atoms of at least 50%.

18. The photosensitive resin composition of claim 1, wherein the fluroresin has a proportion of the units (u1) based on all the units (100 mol %) constituting the copolymer ranges from 60 to 95 mol % and the proportion of the units (u21) ranges from 5 to 40 mol %.

19. The photosensitive resin composition of claim 1, wherein the fluroresin is composed of a copolymer consisting of units of formula (u1) and units of formula (u21).

* * * * *